(12) United States Patent
Spearing et al.

(10) Patent No.: US 8,289,710 B2
(45) Date of Patent: Oct. 16, 2012

(54) LIQUID COOLING SYSTEMS FOR SERVER APPLICATIONS

(75) Inventors: Ian G. Spearing, Westerville, OH (US); Timothy J Schrader, Irwin, OH (US)

(73) Assignee: Liebert Corporation, Columbus, OH (US)

( * ) Notice: Subject to any disclaimer, the term of this patent is extended or adjusted under 35 U.S.C. 154(b) by 243 days.

(21) Appl. No.: 12/351,176

(22) Filed: Jan. 9, 2009

(65) Prior Publication Data

US 2009/0161312 A1 Jun. 25, 2009

Related U.S. Application Data

(63) Continuation-in-part of application No. 11/707,350, filed on Feb. 16, 2007, now Pat. No. 7,599,184, and a continuation-in-part of application No. 11/707,332, filed on Feb. 16, 2007, now Pat. No. 7,539,020.

(60) Provisional application No. 60/774,764, filed on Feb. 16, 2006.

(51) Int. Cl.
   *H05K 7/20* (2006.01)
(52) U.S. Cl. .......... 361/701; 361/679.54; 361/699; 62/259.2; 174/50
(58) Field of Classification Search ............. 361/679.46, 361/679.47, 679.53, 679.54, 688–709, 726, 361/727
See application file for complete search history.

(56) References Cited

U.S. PATENT DOCUMENTS

| | | | |
|---|---|---|---|
| 6,533,840 B2 * | 3/2003 | Martin et al. | 95/45 |
| 6,657,121 B2 * | 12/2003 | Garner | 174/16.3 |
| 6,796,372 B2 * | 9/2004 | Bear | 165/104.21 |
| 7,280,363 B2 * | 10/2007 | Reyzin et al. | 361/719 |
| 7,403,384 B2 * | 7/2008 | Pflueger | 361/688 |
| 7,593,227 B2 * | 9/2009 | Campbell et al. | 361/699 |
| 7,715,194 B2 * | 5/2010 | Brewer et al. | 361/699 |
| 2003/0128516 A1 * | 7/2003 | Faneuf et al. | 361/704 |
| 2003/0128525 A1 | 7/2003 | Berry et al. | |
| 2004/0057211 A1 * | 3/2004 | Kondo et al. | 361/696 |
| 2004/0188081 A1 * | 9/2004 | Oh | 165/185 |
| 2005/0239300 A1 * | 10/2005 | Yasumura et al. | 439/65 |
| 2007/0042514 A1 | 2/2007 | Wu et al. | |
| 2007/0201204 A1 | 8/2007 | Upadhya et al. | |
| 2007/0201210 A1 | 8/2007 | Chow et al. | |
| 2007/0297136 A1 * | 12/2007 | Konshak | 361/699 |

OTHER PUBLICATIONS

Eelco Molenaar, International Search Report for International Patent Application No. PCT/US2010/020473, European Patent Office, dated Apr. 27, 2010.

Eelco Molenaar, Written Opinion for International Patent Application No. PCT/US2010/020473, European Patent Office, dated Apr. 27, 2010.

* cited by examiner

*Primary Examiner* — Courtney Smith
(74) *Attorney, Agent, or Firm* — Locke Lord LLP

(57) ABSTRACT

Mounting systems are provided for bringing a heat exchanger from a server rack into thermal contact with a heat exchanger from an electronics server. An engaging force is applied to the two heat exchangers to create thermal communication there between. A mounting mechanism is configured to isolate the engaging force applied to the two heat exchangers. The mounting mechanism may include an interlocking mechanism that prevents transfer of the applied force to the rest of the electronics server to lessen the possibility of disconnecting the electrical connections between the electronics server and the rack, and/or lessening mechanical stresses transferred to the electronics server and the rack chassis. The mounting mechanism also may be coupled to the electronics server locking mechanism such that the action of locking the electronics server into the rack causes the heat exchangers to engage in thermal contact.

35 Claims, 27 Drawing Sheets

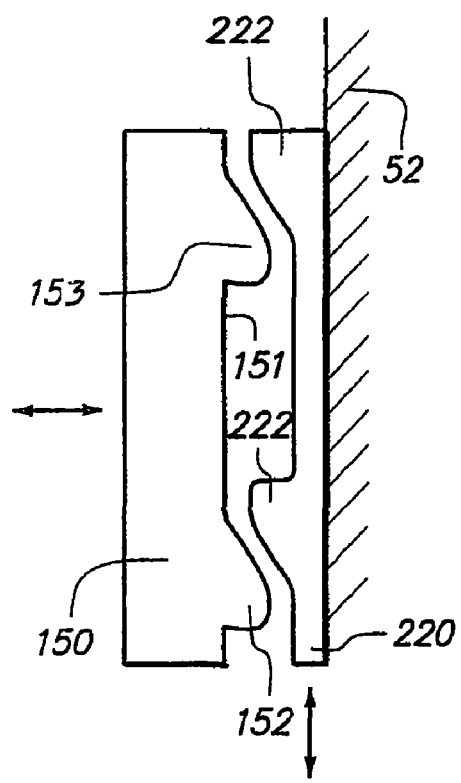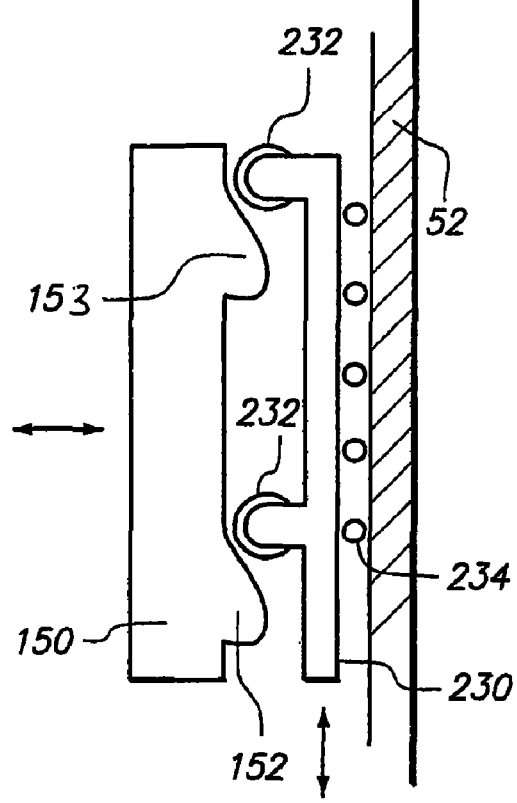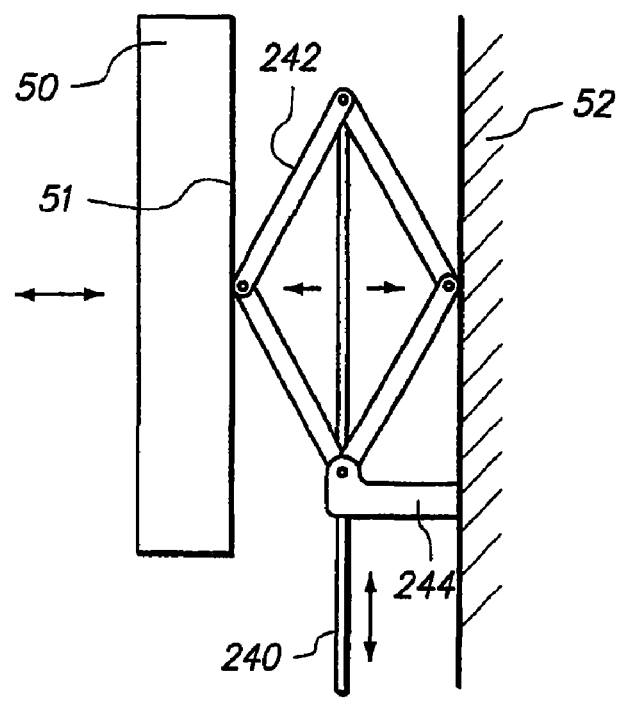

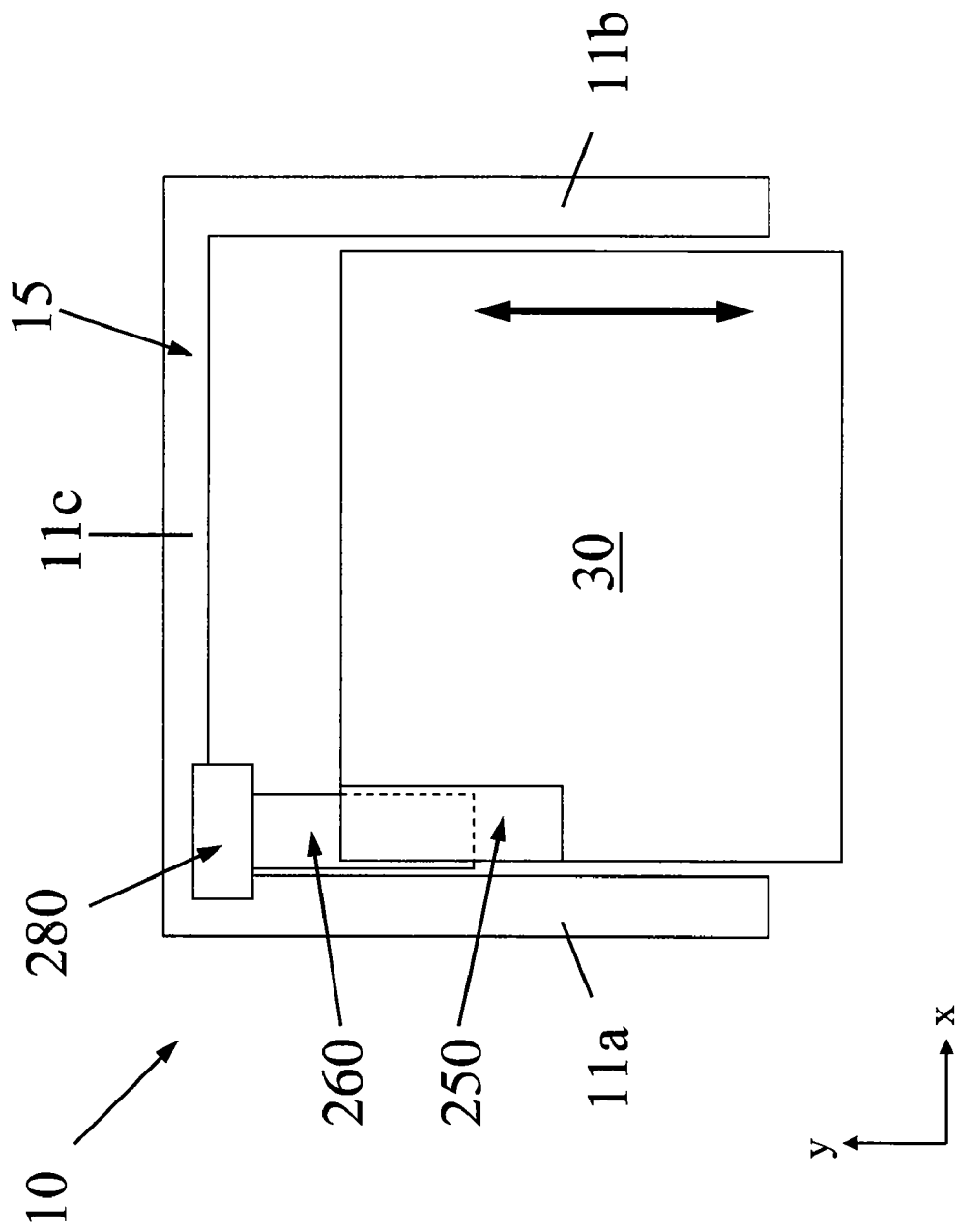

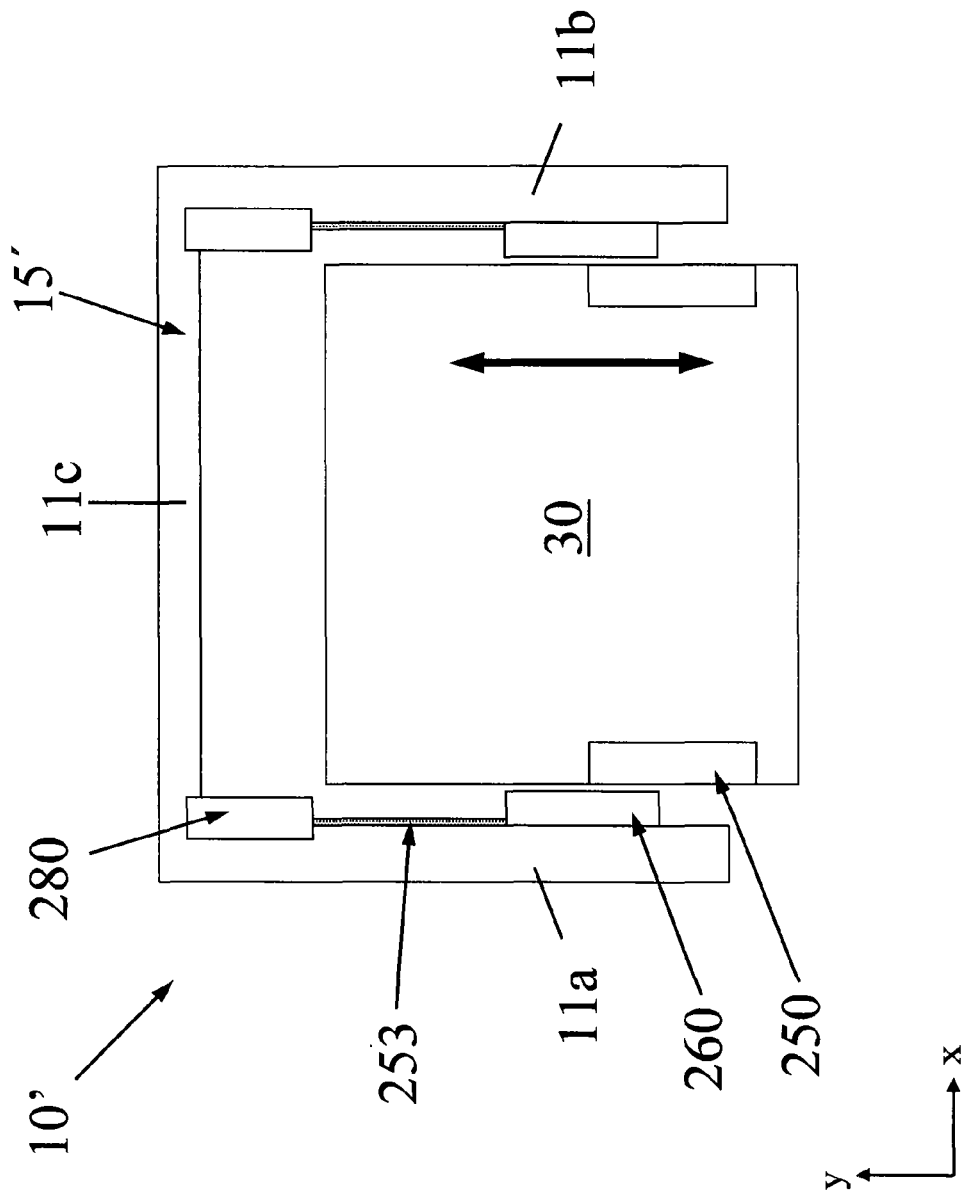

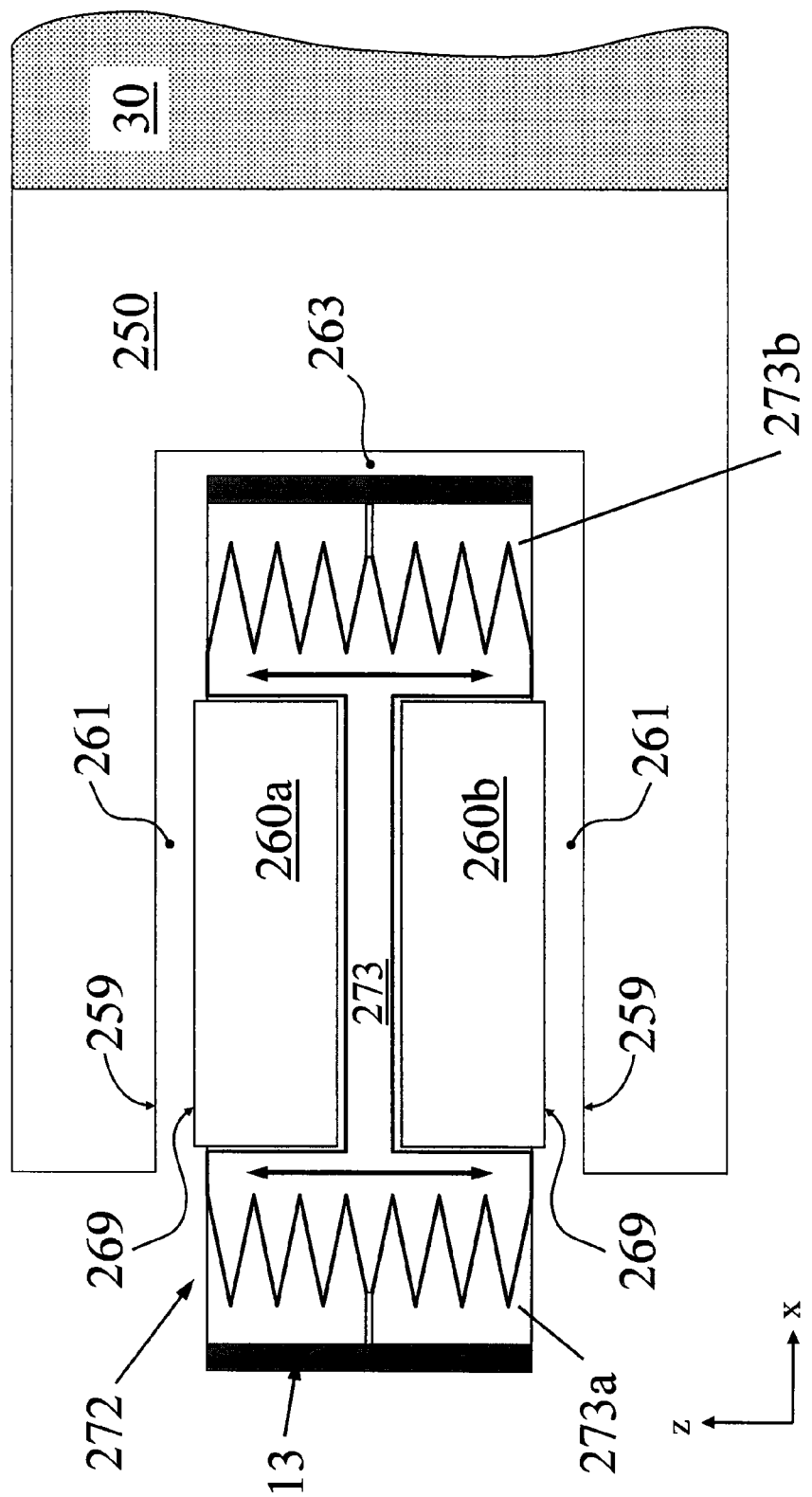

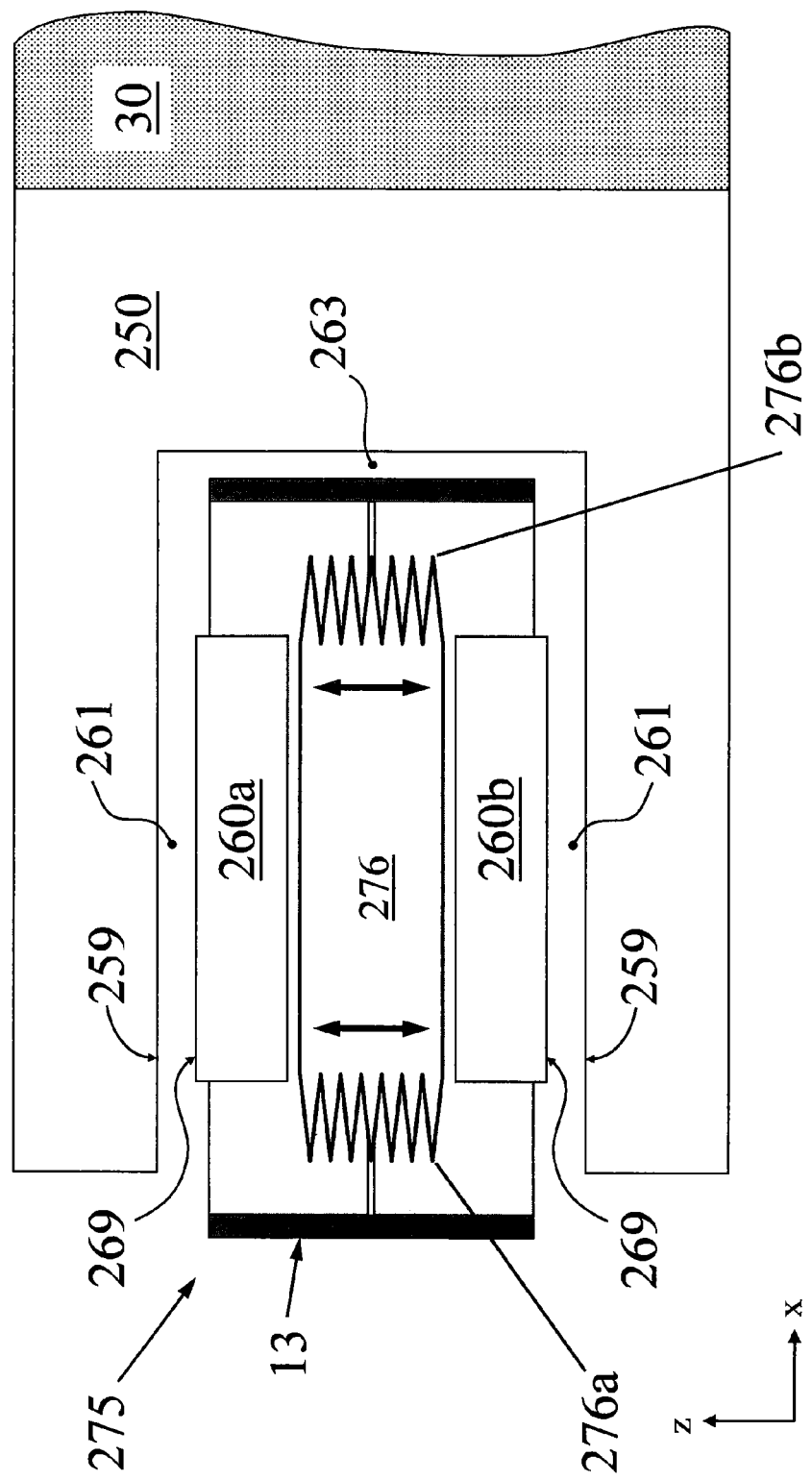

LIQUID COOLING SYSTEMS FOR SERVER APPLICATIONS

CROSS REFERENCE TO RELATED APPLICATIONS

The present application is a continuation-in-part of co-pending U.S. patent application Ser. No. 11/707,350 and U.S. patent application Ser. No. 11/707,332, both of which were filed on Feb. 16, 2007, and both of which claim priority to U.S. Provisional Patent Application Ser. No. 60/774,764, filed Feb. 16, 2006, the contents of each of which are incorporated herein by reference in their entirety for all purposes.

STATEMENT REGARDING FEDERALLY SPONSORED RESEARCH OR DEVELOPMENT

Not applicable.

REFERENCE TO APPENDIX

Not applicable.

BACKGROUND OF THE INVENTION

1. Field of the Invention

This disclosure relates to a mounting mechanism in general, and more particularly to mounting mechanisms useful to form a thermal interface between two heat exchanging devices, systems including such mounting mechanisms, and methods for their manufacture.

2. Description of the Related Art

Cooling of high performance integrated circuits with high heat dissipation is presenting significant challenges in the electronics cooling arena. Conventional cooling using heat pipes and fan mounted heat sinks are not adequate for cooling chips with ever-increasing wattage requirements, including those exceeding 100 W.

Electronics servers, such as blade servers and rack servers, are being used in increasing numbers due to the higher processor performance per unit volume one can achieve. However, the high density of integrated circuits also leads to high thermal density, which is beyond the capability of conventional air-cooling methods.

A particular problem with cooling integrated circuits on electronics servers is that multiple electronics servers are typically mounted in close quarters within a server chassis. In such configurations, electronics servers are separated by a limited amount of space, thereby reducing the dimensions within which to provide an adequate cooling solution. Typically, stacking of electronics servers does not provide the mounting of large fans and heat sinks for each electronics server. Often electronics server stacks within a single server chassis or rack are cooled by one large fan, a heat sink, or both. Using this configuration, the integrated circuits on each electronics server are cooled using the heat sink and the large fans that blow air over the heat sink, or simply by blowing air directly over the electronics servers. However, considering the limited free space surrounding the stacked electronics servers within the server chassis, the amount of air available for cooling the integrated circuits is limited.

As servers continue to increase in power and power density, it is no longer feasible to air cool the entire server rack. Liquid cooling systems, such as closed-loop liquid cooling systems and heat pipes, present alternative methods for conventional cooling solutions. Liquid cooling needs to occur at the integrated circuit level on an electronics server. Due to the density of the electronics and the high power densities of ultra high-performance servers, the heat picked up by a liquid cooling loop cannot be effectively discharged to the air via a radiator, as is common practice in other form factors such as desktops and work stations. The heat must be transferred to the server rack cooling system, which may be comprised of a pumped refrigerant or chilled water loop or the like. A key requirement of servers contained within such rack systems is the ability to swap in and out electronics servers. As such, there is a need to effectively connect and disconnect each electronics server and its corresponding cooling system to and from the rack cooling system.

This application for patent discloses cooling systems suitable for transferring heat produced by one or more heat generating devices from the one or more devices to a separately located environment of different temperature.

BRIEF SUMMARY OF THE INVENTION

Cooling systems of the present invention are directed to cooling solutions used to transfer heat produced by one or more heat generating devices, such as microprocessors or other integrated circuits, from one or more electronics servers to an ambient environment, such as the atmosphere (air), water or other suitable liquids, and the like. In some embodiments, a liquid-based cooling system is used. A server chassis is configured to house multiple electronics servers. Examples of electronics servers include, but are not limited to, blade servers and rack servers. Each electronics server is coupled to a backplane or mid-plane within the server chassis. For purposes of this disclosure, the terms "backplane" and "mid-plane" are used interchangeably. Each electronics server includes one or more heat generating devices. Integrated onto each electronics server is a liquid based cooling system. Each liquid based cooling system includes a server pump and one or more microchannel cold plates (MCP). Fluid lines preferably couple the MCPs and the server pump. In other embodiments, heat pipes or conduction means are used instead of the liquid-based cooling system.

The liquid based cooling system for each electronics server includes a rejector plate. Each rejector plate is configured with fluid channels, preferably micro-channels. Alternatively, each rejector plate is configured with macro-channels. The micro-channels are coupled to the fluid lines thereby forming a first closed loop including the MCPs, the server pump and the rejector plate. The rejector plate is coupled to a chassis cold plate via a thermal interface material, thereby forming a thermal interface. The thermal interface is configured along a plane that is non-perpendicular to an insertion vector of the electronics server into a server rack chassis. In some embodiments, the thermal interface plane is parallel to the insertion vector. The rejector plates for each of the electronics servers are coupled to the chassis cold plate in this manner. The chassis cold plate is coupled to the server chassis. The chassis cold plate includes one or more heat exchanging elements.

The chassis cold plate includes fluid channels which are coupled via fluid lines to a liquid-to-air heat exchanging system. The liquid-to-air heat exchanging system includes a heat rejector, one or more fans, and an external pump. The chassis cold plate, the heat rejector, the external pump, and fluid lines connected thereto form a second closed loop.

Fluid is pumped through the first closed loop such that heat generated by each heat generating device on the electronics server is transferred to the fluid flowing through each respective MCP coupled to the heat generating devices. The heated fluid flows into the fluid channels within the rejector plate. Within the second closed loop system, fluid is pumped through the fluid channels in the chassis cold plate by the external pump. Heat within the fluid flowing though each rejector plate is transferred through a thermal interface to the chassis cold plate and to the fluid flowing through the chassis cold plate. Heated fluid within the chassis cold plate is pumped to the heat rejector within the liquid-to-air heat exchanging system, where heat is transferred from the fluid to the air. Fluid flowing in the first closed loop system is independent of fluid flowing in the second closed loop system.

Fundamental to the operation of the independent cooling loops system described above is the thermal interface formed between the rejector plate of the electronics server and the chassis cold plate of the server rack. These cooling systems provide mechanisms and form factors for bringing a heat exchanger from the rack into thermal contact with a heat exchanger from the electronics server. For low thermal resistance, a thermal interface material (TIM), such as thermal grease or a thermal pad, may be used. To ensure good thermal contact, pressure is applied between the two heat exchangers, the rejector plate and the chassis cold plate. Methods for applying pressure include, but are not limited to, mechanical clamping, springs, electromechanical motors or actuators, pneumatics, and hydraulics. The heat exchangers can take a variety of shapes, including planar, cylindrical, curvilinear, or other non-planar configurations. The mating surfaces of the heat exchangers can be smooth or with physical features such as mating teeth to increase surface area or ensure alignment. Thermal contact can be made on one or more surfaces creating a sandwich type structure. A heat exchanger can be a single solid piece or can be made up of an array of smaller heat exchangers to allow flexibility when mating curved surfaces to curved surfaces.

The mounting mechanism used to engage and disengage the heat exchangers is configured to isolate the force applied to the two heat exchangers. The mounting mechanism includes an interlocking channel mechanism that prevents transfer of the applied force to the rest of the electronics server or rack chassis. Without isolating this force, the force applied to the electronics server may result in disconnecting the electrical connections between the electronics server and the rack, as well as providing mechanical stress to the electronics server and the rack chassis. The mounting mechanism can be coupled to the electronics server locking mechanism such that the action of locking the electronics server into the server rack causes the heat exchangers to engage in thermal contact. This is a fail-safe procedure because no separate process is required to engage the electronics server cooling loop. Similarly, unlocking the electronics server causes the heat exchangers to disengage allowing the electronics to be removed without interference from either the electronics server cooling loop or the rack cooling loop.

Other features and advantages of the present invention will become apparent after reviewing the detailed description of the embodiments set forth below.

BRIEF DESCRIPTION OF THE SEVERAL VIEWS OF THE DRAWINGS

The following figures form part of the present specification and are included to further demonstrate certain aspects of the present invention. The invention may be better understood by reference to one or more of these figures in combination with the detailed description of specific embodiments presented herein.

FIG. 17 illustrates a top-down view of a first ramp translation mechanism.

FIG. 18 illustrates a top-down view of a second ramp translation mechanism.

FIG. 19 illustrates a top-down view of a scissor jack translation mechanism.

FIG. 23A illustrates a schematic top view of an exemplary cooling system of the present disclosure.

FIG. 23B illustrates an alternative exemplary cooling system of the present disclosure.

FIG. 24A illustrates a front view of an exemplary planar thermal interface with an exemplary bellows in a compressed state.

FIG. 24B illustrates a front view of a second exemplary planar thermal interface with a second exemplary bellows in a compressed state.

FIG. 34A illustrates a side view of an assembled but unformed/unrolled exemplary laminate manifold assembly.

FIG. 34B illustrates a top view of an unformed/unrolled, exemplary manifold assembly with heat exchanger segments and the fluid path there through.

FIG. 34C illustrates a front view of an exemplary manifold assembly with heat exchanger segments in the formed/rolled state.

FIG. 34D illustrates a cross-section view of an exemplary segment of a multi-segment chassis cold plate heat exchanger and the fluid path there through suitable for use with the laminate manifold assembly.

Figure 1:
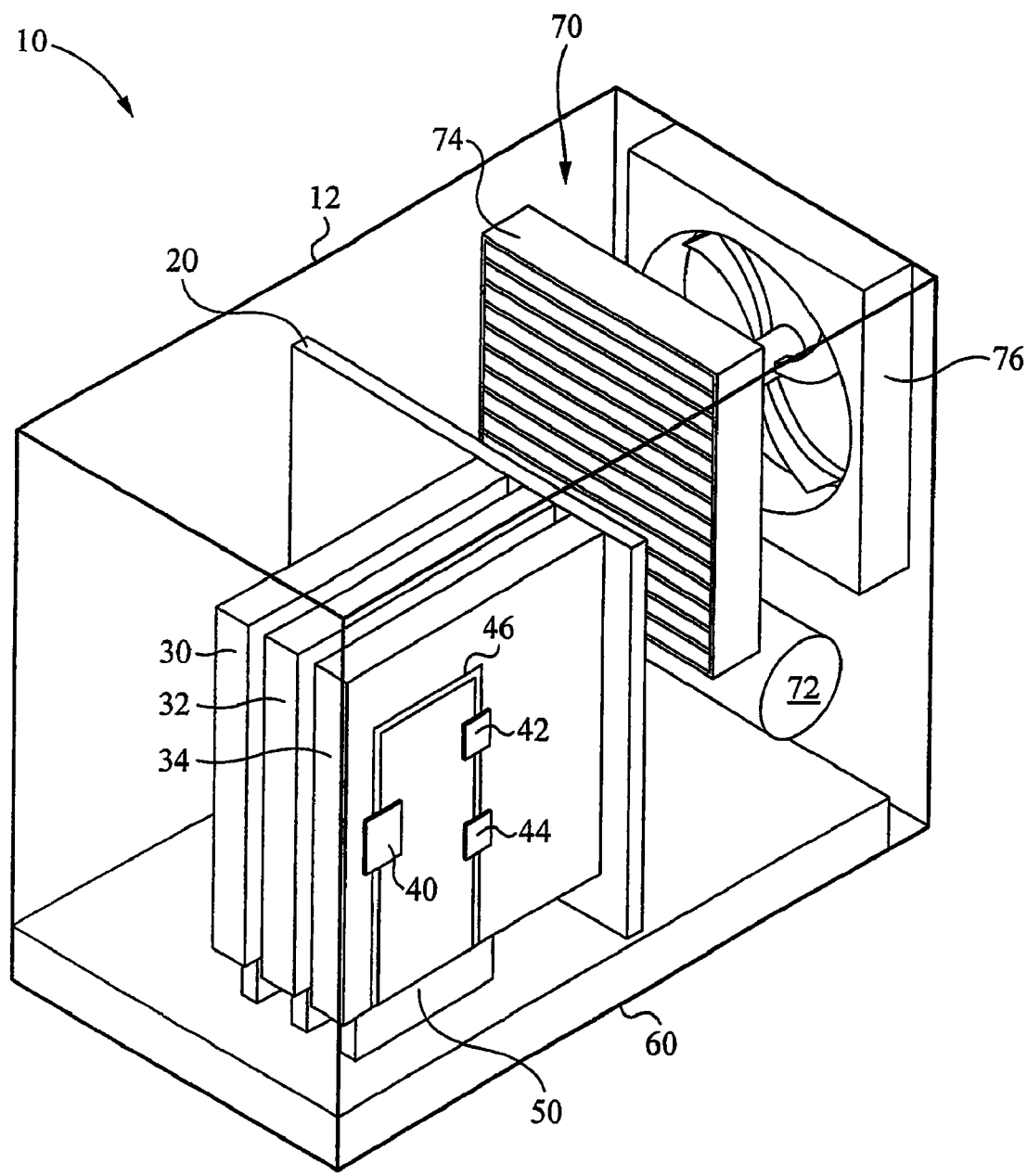
FIG. 1 illustrates a perspective view of an exemplary cooling system according to the first embodiment of the present disclosure.

While the inventions disclosed herein are susceptible to various modifications and alternative forms, only a few specific embodiments have been shown by way of example in the drawings and are described in detail below. The figures and detailed descriptions of these specific embodiments are not intended to limit the breadth or scope of the inventive concepts or the appended claims in any manner. Rather, the figures and detailed written descriptions are provided to illustrate the inventive concepts to a person of ordinary skill in the art and to enable such person to make and use the inventive concepts.

DETAILED DESCRIPTION

One or more illustrative embodiments incorporating the invention disclosed herein are presented below. Not all features of an actual implementation are described or shown in this application for the sake of clarity. It is understood that in the development of an actual embodiment incorporating the present invention, numerous implementation-specific decisions must be made to achieve the developer's goals, such as compliance with system-related, business-related, government-related and other constraints, which vary by implementation and from time to time. While a developer's efforts might be complex and time-consuming, such efforts would be, nevertheless, a routine undertaking for those of ordinary skill in the art having benefit of this disclosure.

The Figures described above and the written description of specific structures and functions below are not presented to limit the scope of what Applicants have invented or the scope of the appended claims. Rather, the Figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a," is not intended as limiting of the number of items. Also, the use of relational terms, such as, but not limited to, "top," "bottom," "left," "right," "upper," "lower," "down," "up," "side," and the like are used in the written description for clarity in specific reference to the Figures and are not intended to limit the scope of the invention or the appended claims.

Embodiments of the present invention are directed to a cooling system that transfers heat generated by one or more heat-generating devices on an electronics server to a liquid-to-air heat exchanging system. The cooling system described herein can be applied to any electronics sub-system that is mounted to a backplane, including but not limited to, a blade server and a rack server. A server chassis is configured to house multiple electronic servers. Each electronics server is coupled to a backplane or mid-plane within the server chassis. Each electronics server includes one or more processors as is well known in the art. Integrated onto each electronics server is a cooling system. In some embodiments, the cooling system is a liquid-based cooling system. Each liquid-based cooling system includes a server pump and one or more micro-channel cold plates (MCP). Preferably, each liquid-based cooling system is configured with one MCP for each heat generating device on the electronics server. The MCPs and the server pump are preferably mounted to the electronics server. Fluid lines couple the MCPs and the server pump. Alternatively, any means for transporting fluid within a sealed environment can be used. The server pump is any conventional pump, including, but not limited to, an electro-osmotic pump and a mechanical pump. In other embodiments, heat pipes or conduction means are used instead of the liquid-based cooling system.

In a first embodiment, the liquid based cooling system for each electronics server includes a rejector plate. The fluid lines coupling the MCPs and the server pump are also coupled to the rejector plate with fluid channels configured therein.

The MCPs, the server pump, the rejector plate, and the fluid lines connected thereto form a first closed loop. Each server chassis includes at least one chassis cold plate. The rejector plate is coupled to the chassis cold plate via a thermal interface material. The rejector plates for each of the electronics servers are coupled to the chassis cold plate in this manner such that all rejector plates, and therefore the cooling system for each electronics server, are coupled to the chassis cold plate. Each electronics server is installed into a backplane along an insertion vector. The thermal interface between the rejector plate of the electronics server and the chassis cold plate is formed along a non-perpendicular plane relative to the insertion vector. In some embodiments, the thermal interface plane is parallel to the insertion vector. In order to couple the rejector plate to the chassis cold plate, a mounting mechanism is used.

The chassis cold plate includes fluid channels which are coupled via fluid lines to a liquid-to-air heat exchanging system. The liquid-to-air heat exchanging system includes a heat rejector, one or more fans, and an external pump. Fluid lines couple the chassis cold plate to the heat rejector, the heat rejector to the external pump, and the external pump to the chassis cold plate. The chassis cold plate, the heat rejector, the external pump, and the fluid lines connected thereto form a second closed loop. At least one blowing fan is preferably included to generate airflow over the surface of the heat rejector. The heat rejector is preferably a counter-flow radiator. In some embodiments, the entire chassis cold plate and the liquid-to-air heat exchanging system is included within a single enclosure, such as the server housing. In other embodiments, a portion of the chassis cold plate extends external to the server housing and the liquid-to-air heat exchanging system is remotely located to the server housing.

In operation, within the liquid based cooling system for each electronics server, fluid is pumped through the fluid lines and the MCPs by the server pump such that heat generated by each heat generating device on the electronics server is transferred to the fluid flowing through each respective MCP coupled to the heat generating devices. Heat is transferred from the heat generating devices to the fluid flowing through the MCPs, and the heated fluid flows into the fluid channels within the rejector plate. Within the second closed loop system, fluid is pumped through the fluid channels in the chassis cold plate by the external pump. Thermal characteristics of the rejector plate, the chassis cold plate, and the thermal interface material between the rejector plate and the chassis cold plate are configured such that heat within the fluid flowing through each rejector plate is transferred to the fluid flowing through the chassis cold plate. Heated fluid within the chassis cold plate is pumped to the heat rejector within the liquid-to-air heat exchanging system, where heat is transferred from the fluid to the air. The cooled fluid exits the liquid-to-air heat exchanging system and is pumped back to the chassis cold plate. In a preferred embodiment, the second closed loop system (i.e., the closed loop system associated with the chassis) may comprise a pumped two-phase refrigerant system, such as embodiments of the systems disclosed in commonly-owned U.S. patent application Ser. No. 10/904,889, the entire subject matter and disclosure of which is hereby incorporated herein for all purposes. It will also be appreciated that the first closed loop system (i.e., the closed loop system associated with the electronic component) alternately or additionally may be a pumped two-phase refrigerant system.

FIG. 1 illustrates a perspective view of an exemplary cooling system 10 according to the first embodiment of the present invention. The cooling system 10 includes a chassis housing 12 for housing a back plane 20, a chassis cold plate 60, and a liquid-to-air heat exchanging system 70. The cooling system 10 is configured to cool up to N electronics servers. A first electronics server 30, a second electronics server 32, and an nth electronics server 34 are each mounted and electronically coupled to the back plane 20. For purposes of discussion, each electronics server 30, 32, 34 includes two processors. It is understood that each electronics server can be configured independently and that each electronics server can include more or less than two processors. Coupled to each electronics server 30, 32, 34 is a liquid based cooling system that includes at least one server pump 40, an MCP 42, an MCP 44, and a rejector plate 50. Preferably, the liquid based cooling system includes one MCP for each processor on the corresponding electronics server. In this exemplary case in which each electronics server 30, 32, 34 includes two processors, each liquid based cooling system includes two corresponding MCPs, preferably one per processor.

Preferably, the server pump 40 is a mechanical pump. Alternatively, the server pump 40 is an electro-osmotic pump. However, it is apparent to one skilled in the art that any type of pump is alternatively contemplated. Preferably, each MCP 42, 44 is a fluid-based, microchannel heat exchanger of the type described in U.S. Pat. No. 7,000,684, the full content and disclosure of which is hereby incorporated herein by reference. However, it is apparent to one skilled in the art that any type of fluid-based heat exchanger is alternatively contemplated. Preferably, the rejector plate 50 is configured with micro-channels that maximize a surface area exposed to a fluid passing there through.

A bottom surface of the rejector plate 50 is thermally coupled to a top surface of the chassis cold plate 60. In this manner, the rejector plate 50 for each electronics server 30, 32, 34 is thermally coupled to the chassis cold plate 60. The chassis plate 60 is preferably configured with micro-channels that maximize a surface area exposed to a fluid passing there through.

Each of the electronics servers 30, 32, 34 is coupled to the backplane 20 along an insertion vector. The insertion vector is perpendicular to the backplane 20. A thermal interface between the rejector plate 50 and the chassis cold plate 60 is formed along a non-perpendicular plane relative to the insertion vector. In some embodiments, the thermal interface plane is parallel to the insertion vector.

The liquid-to-air heat exchanging system 70 includes an external pump 72, a heat rejector 74, and a fan 76. The external pump 72 and the heat rejector 74 are coupled to the chassis cold plate 60. Preferably, the external pump 72 is a mechanical pump. Alternatively, the external pump 72 is an electro-osmotic pump. However, it is apparent to one skilled in the art that any type of pump is alternatively contemplated. The heat rejector 74 is preferably a radiator with micro-channels and fins positioned closely together. More preferably, the heat rejector 74 is a counter-flow radiator of the type described in U.S. Pat. No. 6,988,535, the full content and disclosure of which is hereby incorporated by reference. However, it is apparent to one skilled in the art that any type of heat rejector is alternatively contemplated. The fan 76 comprises one or more blowing fans for generating air flow across and/or through the heat rejector 74.

Figure 2:
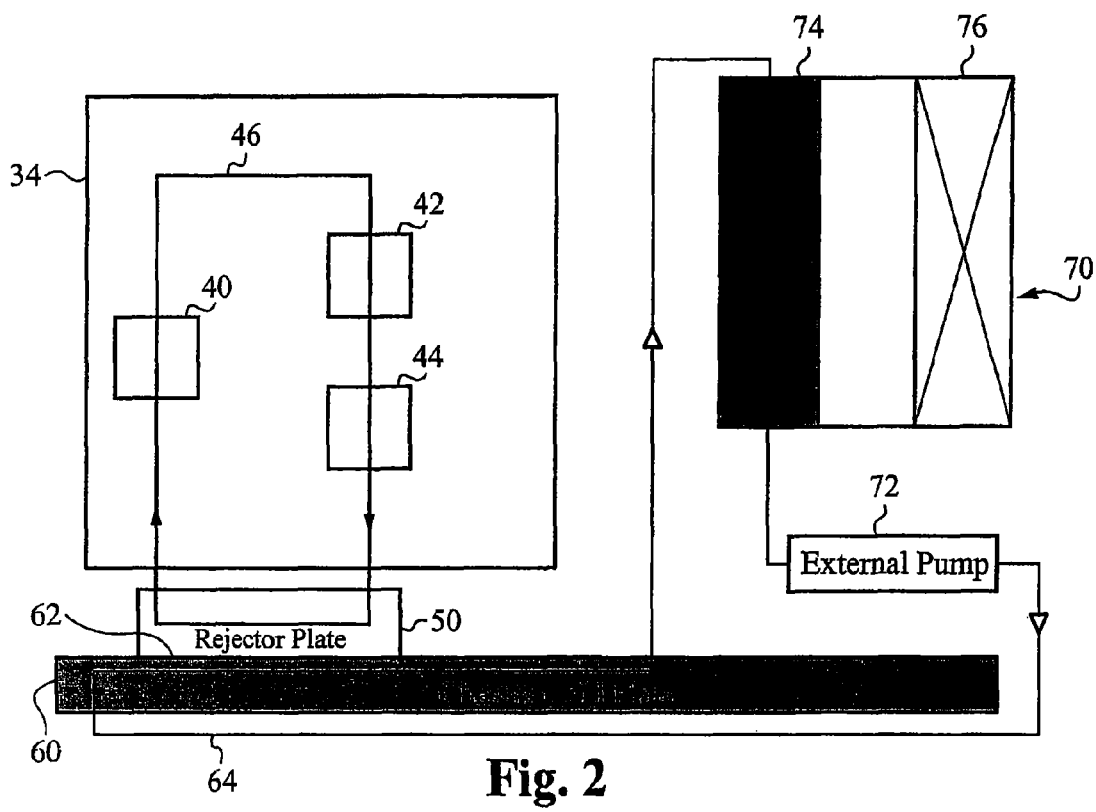
FIG. 2 illustrates a side view of the $n^{th}$ electronics server coupled to the liquid-to-air heat exchanging system.

FIG. 2 illustrates a side view of the nth electronics server 34 coupled to the liquid-to-air heat exchanging system 70. As shown in FIG. 2, the server pump 40 is coupled to the MCP 42 by one or more fluid lines 46. The MCP 42 is coupled to the MCP 44 by one or more fluid lines 46. The MCP 44 is coupled to the rejector plate 50 by one or more fluid lines 46. The rejector plate 50 is coupled to the server pump 40 by one or more fluid lines 46. The fluid lines 46 are metallic or non-metallic.

Although the MCP 42 and the MCP 44 are shown in FIG. 2 as being coupled in series, alternative configurations are also contemplated. For example, each MCP within a given liquid-based cooling system can be configured in parallel such that fluid reaching any of the MCPs has not previously passed through, and been heated by, another MCP. In this manner, fluid reaching any MCP configured in parallel is cooler than if the fluid first passes through a serially connected MCP. In such an alternative configuration, the server pump 40 is coupled to the MCP 42 by one or more fluid lines 46, and separate fluid lines couple the server pump 40 to the MCP 44. In this alternative embodiment, one or more fluid lines couple the MCP 42 to the rejector plate 50 and one or more fluid lines couple the MCP 44 to the rejector plate 50. Alternatively, the one or more fluid lines leaving the MCP 42 and the one or more fluid lines leaving the MCP 44 are joined prior to coupling with the rejector plate 50. In yet other alternative configurations, multiple MCPs are configured in any combination of series and parallel configurations.

The MCP 42, the MCP 44, the rejector plate 50, the server pump 40, and the fluid lines 46 form a first closed loop through which fluid flows. A function of the liquid-based cooling system of FIG. 2, which includes the first closed loop, is to capture heat generated by the two processors (not shown) on the electronics server 34. The MCP 42 is thermally coupled to a first processor on the electronics server 34. Similarly, the MCP 44 is thermally coupled to a second processor on the electronics server 34. As fluid flows through the MCP 42, heat from the first processor is transferred to the fluid. As fluid flows through the MCP 44, heat from the second processor is transferred to the fluid.

The type of fluid used in the liquid-based cooling system is preferably water-based. Alternatively, the fluid within the liquid-based cooling system is based on combinations of organic solutions, including but not limited to propylene glycol, ethanol and isopropanol (IPA). Still alternatively, the fluid within the liquid-based cooling system is a pumped refrigerant. The fluid used in the liquid-based cooling system also preferably exhibits a low freezing temperature and has anti-corrosive characteristics. Depending on the operating characteristics of the liquid-based cooling system and the electronics server processors, in one embodiment, the fluid exhibits single phase flow while circulating within the liquid-based cooling system. In another embodiment, the fluid is heated to a temperature to exhibit two phase flow, wherein the fluid undergoes a phase transition from liquid to a vapor or liquid/vapor mix.

The heated fluid flows from the MCPs 42, 44 into the micro-channels within the rejector plate 50. Heat is transferred from the heated fluid within the micro-channels to the material of the rejector plate 50. A thermal interface material 62 provides efficient heat transfer between the rejector plate 50 and the chassis cold plate 60 so that heat from the rejector plate 50 is transferred to the material of the chassis cold plate 60. The thermal interface material 62 is preferably a compliant material such as thermal grease, solder, or any type of thermally conducting gap filling material.

As shown in FIG. 2, the chassis cold plate 60 is coupled to the external pump 72 by one or more fluid lines 64. The chassis cold plate 60 is coupled to the heat rejector 74 by one or more fluid lines 64. The heat rejector 74 is coupled to the external pump 72 by one or more fluid lines 64. The fluid lines 64 are metallic or non-metallic. The chassis cold plate 60, the heat rejector 74, the external pump 72, and the fluid lines 64 form a second closed loop through which fluid flows. The fluid in the second closed loop preferably comprises the same type of fluid discussed above in relation to the first closed loop. The fluid in the second closed loop is independent of the fluid in the first closed loop.

A function of the second closed loop and the liquid-to-air heat exchanging system 70 is to transfer heat from the chassis cold plate 60 to the ambient environment, such as air, water (or any other appropriate fluids), and the like. As fluid flows through the micro-channels within the chassis cold plate 60, heat from material of the chassis cold plate 60 is transferred to the fluid. The heated fluid flows to the heat rejector 74. As the heated fluid flow through the heat rejector 74, heat is transferred from the fluid to the material of the heat rejector 74. The fan 76 blows air over the surface of the heat rejector 74 such that heat is transferred from the heat rejector 74 to the ambient environment. Preferably, the chassis 12 (FIG. 1) includes intake vents and exhaust vents through which air enters and leaves the cooling system 10 (FIG. 1). Cooled fluid leaving the heat rejector 74 flows back to the chassis cold plate 60.

Figure 3:
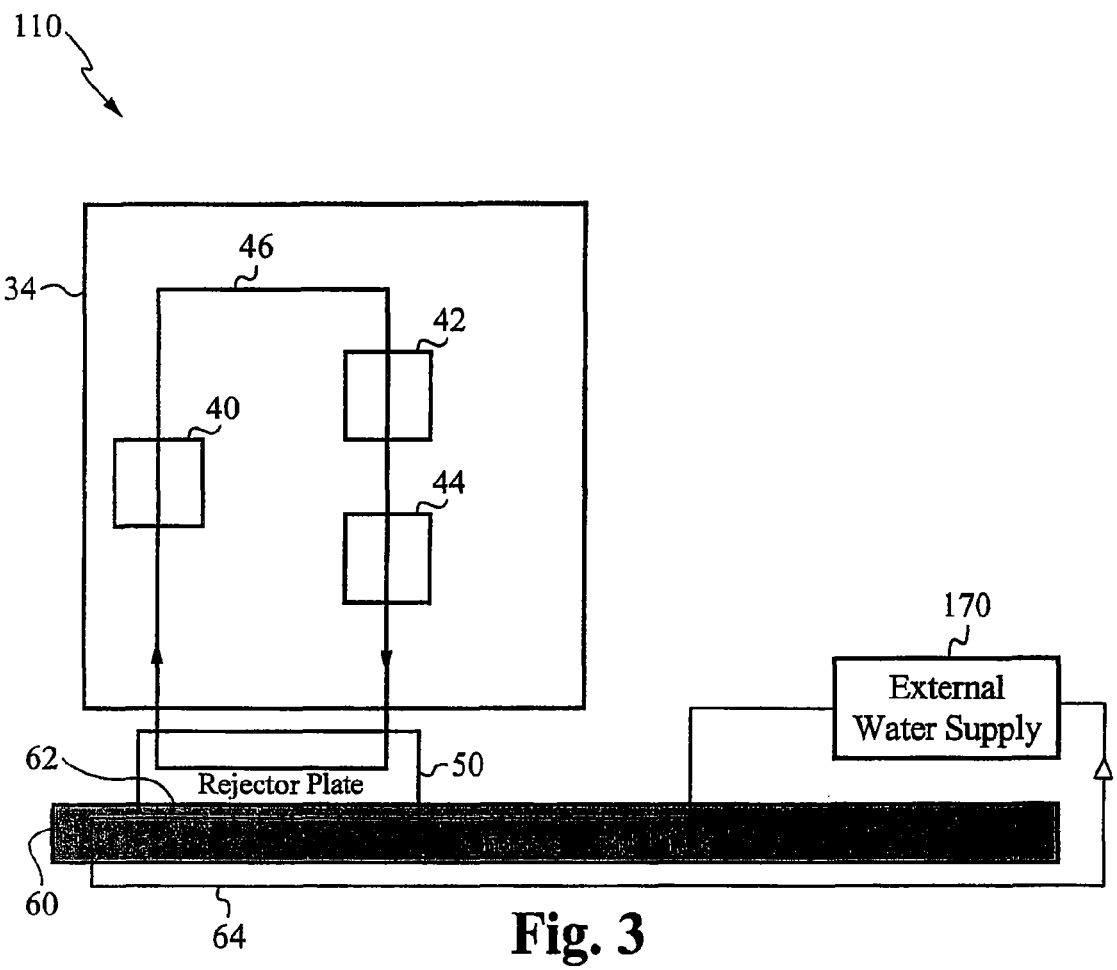
FIG. 3 illustrates a side view of an exemplary cooling system according to a second embodiment of the present disclosure.

FIG. 3 illustrates a view of an exemplary cooling system according to a second embodiment of the present invention. The cooling system 110 can be identical to the cooling system 10 of FIG. 1 with the exception that the liquid-to-air heat exchanging system 70 (FIG. 1) of cooling system 10 is replaced by an external water supply 170. The external water supply 170 represents a continuous running water supply, such as the public water supply provided to most commercial and residential facilities. Alternatively, the external water supply 170 represents an external source of any type of fluid to which heat is transferred. In operation of the cooling system 110, fresh water from the external water supply 170 flows to the chassis cold plate 60. Heat from the chassis cold plate 60 is transferred to the water in the same manner as that described in relation to cooling system 10 (FIG. 1). The heated water flows from the chassis cold plate 60 to the external water supply 170, where the heated water is disposed. Pressure from the water entering the fluid lines 64 from the external water supply 170 is sufficient to circulate the water through the chassis cold plate 60 and back to the external water supply for disposal. Alternatively, an external pump is coupled to the fluid lines 64 between the external water supply 170 and the chassis cold plate 60 to pump the water to the chassis cold plate 60.

In a third embodiment, the chassis cold plate is modified with quick connects and the rejector plate is removed from each electronics server such that the fluid lines within the liquid based cooling system of each electronics server are coupled directly to the micro-channels within the chassis cold plate via the quick connects. The fluid lines within each liquid based cooling system are modified with appropriate fittings to couple with the quick connects on the chassis cold plate. In an alternative configuration of the third embodiment, the quick connects are configured onto the fluid lines of the liquid based cooling system, and the chassis cold plate is configured with appropriate fittings to couple with the quick connects on each electronics server.

Figure 5:
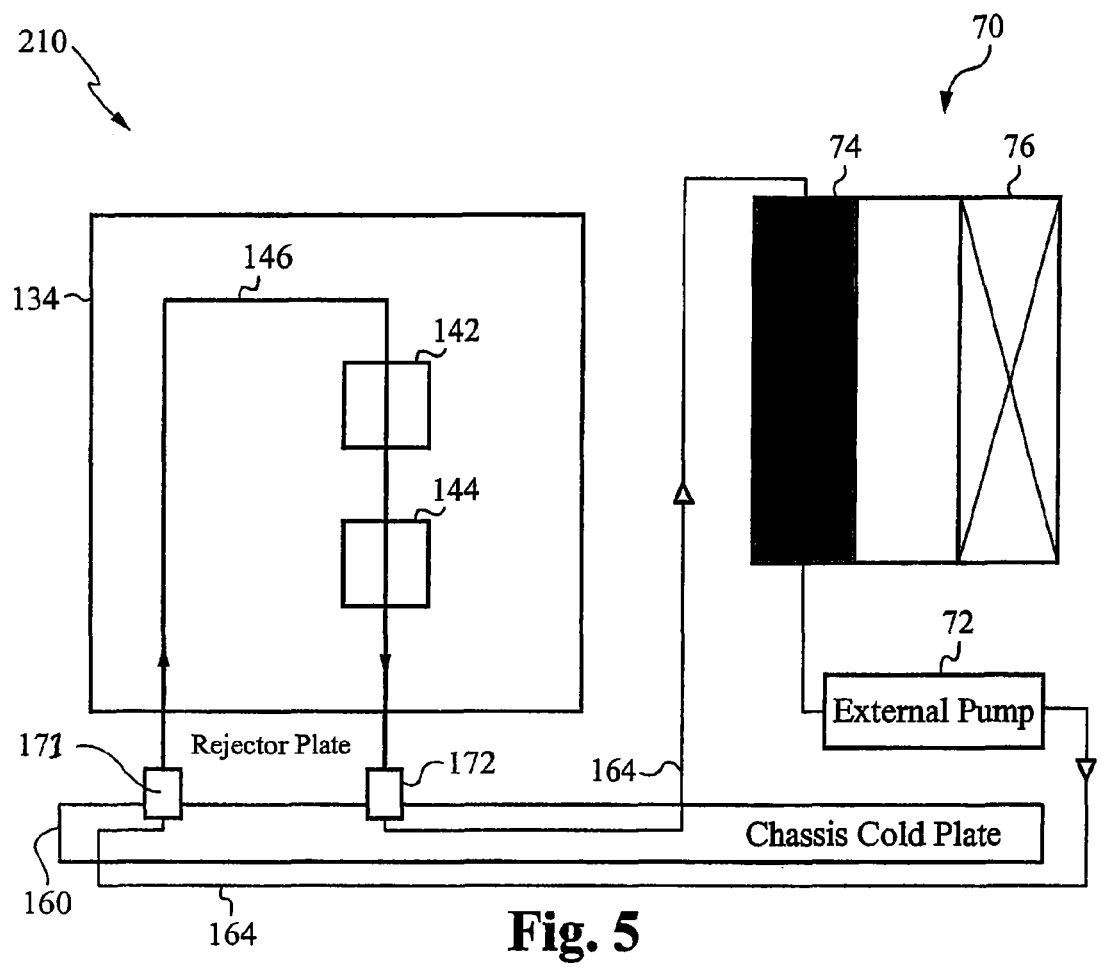
FIG. 5 illustrates a side view of an exemplary cooling system according to the third embodiment of the present disclosure.

FIG. 5 illustrates a side view of an exemplary cooling system 210 according to the third embodiment of the present invention. Although cooling system 210 is shown in FIG. 5 as including only a single electronics server 134, it is understood that the cooling system 210 also includes a chassis housing (not shown) and a back plane (not shown) configured to hold up to N electronics servers in a manner similar to that described in relation to cooling system 10 in FIG. 1. For purposes of discussion, each electronics server within the cooling system 210 is described as including two processors. It is again understood that each electronics server can include more or less than two heat generating devices, such as processors.

A liquid-based cooling system is coupled to the electronics server 134. The liquid-based cooling system includes an MCP 142 and an MCP 144 coupled together via one or more fluid lines 146. The liquid based cooling system includes one MCP coupled to each processor on the electronics server 134. Each MCP 142, 144 is functionally equivalent to the MCPs 42, 44 (FIGS. 1-3).

The cooling system 210 includes the liquid-to-air heat exchanging system 70 coupled to a chassis cold plate 160 via one or more fluid lines 164. The chassis cold plate 160 is configured with micro-channels that enhance a surface area exposed to a fluid passing there through. The chassis cold plate 160 is also configured with quick connects 171 and 172. The fluid lines 146 are configured with appropriate fittings to couple with the quick connects 171 and 172. In the cooling system 210, the fluid lines 146 are coupled directly to the micro-channels of the chassis cold plate 160 via the quick connects 171, 172. In this manner, the liquid-based cooling system coupled to electronics server 134, the chassis cold plate 160, the heat rejector 74, the external pump 72, and the fluid lines 164 form a single closed loop. Within this closed loop, the fluid is pumped by the external pump 72. The type of fluid used in the cooling system of the third embodiment is the same type of fluid used in the cooling system 10 of the first embodiment.

Although FIG. 5 shows a single quick connect 171 through which fluid flows from the chassis cold plate 160 to the fluid lines 146, the quick connect 171 is representative of one or more physical quick connects through which fluid flows from the micro-channels in the chassis cold plate 160 to the one or more fluid lines 146. Similarly, although FIG. 5 shows a single quick connect 172 through which fluid flows from the fluid lines 146 to the chassis cold plate 160, the quick connect 172 is representative of one or more physical quick connects through which fluid flows from the one or more fluid lines 146 to the micro-channels in the chassis cold plate 160.

Although the MCP 142 and the MCP 144 are shown in FIG. 5 as being coupled in series, alternative configurations are also contemplated. For example, each MCP within a given liquid-based cooling system is configured in parallel. In such an alternative configuration, the quick connects 171 are coupled to the MCP 142 by one or more fluid lines 146, and separate fluid lines couple the quick connects 171 to the MCP 144. In this alternative embodiment, one or more fluid lines couple the MCP 142 to the quick connects 172 and one or more fluid lines couple the MCP 144 to the quick connects 172. Alternatively, there is not a one-to-one relationship between the number of quick connects 171 to the number of MCPs in the liquid based cooling system, and there is not a one-to-one relationship between the number of MCPs and the number of quick connects 172. In yet other alternative configurations, multiple MCPs are configured in any combination of series and parallel configurations.

A function of the liquid-based cooling system of FIG. 5, which includes the MCPs 142, 144 and the fluid lines 146, is to capture heat generated by the two processors (not shown) on the electronics server 134. The MCP 142 is thermally coupled to a first processor on the electronics server 134. Similarly, the MCP 144 is thermally coupled to a second processor on the electronics server 134. As fluid flows through the MCP 142, heat from the first processor is transferred to the fluid. As fluid flows through the MCP 144, heat from the second processor is transferred to the fluid.

The heated fluid flows from the fluid lines 146 into the micro-channels within the chassis cold plate 160 via the quick connect 172. As shown in FIG. 5, the chassis cold plate 160 is coupled to the external pump 72 by one or more fluid lines 164. In addition, the chassis cold plate 160 is coupled to the heat rejector 74 by one or more fluid lines 164. The heated fluid in the micro-channels of the chassis cold plate 160 flows to the heat rejector 74 via fluid lines 164. The fluid lines 164 are metallic or non-metallic.

As previously described, a function of the liquid-to-air heat exchanging system 70 is to transfer heat from a fluid to the ambient environment. As the heated fluids flow through the heat rejector 74, heat is transferred from the fluid to the material of the heat rejector 74. The fan 76 blows air over the outer surface of the heat rejector such that heat is transferred from the heat rejector 74 to the ambient environment. Cooled fluid leaving the heat rejector 74 flows back to the chassis cold plate 160 via fluid lines 164. The cooled fluid flows through the chassis cold plate 160 to the fluid lines 146 via the quick connect 171. The cooled fluid flows to the MCPs 142 and 144.

It is apparent to one skilled in the art that the present cooling system is not limited to the components shown in FIG. 1-5 and alternatively includes other components and devices. For example, although not shown in FIG. 1, the cooling system 10 can also include a reservoir coupled to either the closed loop of the liquid based cooling system, the closed loop of the chassis cold plate 60, the heat rejector 74, the external pump 72, and the fluid lines 64, or both closed loops. The fluid reservoir accounts for fluid loss over time due to permeation.

When connecting an electronics server to a rack system through the use of quick disconnects, additional factors may be considered. One consideration is that such a liquid connection is made in the data room. Anytime a connection is made or broken, there is a chance for a leak. The connection also usually occurs as a separate step from the electrical connections which occur when the electronics server is inserted and locked into the rack. As a separate connection, this is not fail-safe. For example, the processor can be turned on without having connected the cooling loop causing an overheating event or damage to the CPU. Another consideration is that if the cooling loop is correctly connected, the cooling loop on the electronics server will share the same fluid as the full rack system. Sharing the rack system fluid can lead to reliability issues, specifically clogging. The length scales of features in an efficient heat exchanger used to transfer heat from a processor are measured in microns. Chilled water lines can have scale and other particulate which may not be an issue at rack level cooling but can quickly clog a heat exchanger at the board level. Another consideration is that the level of control of materials used for larger scale cooling applications is also different then that for an electronics server cooling loop and corrosion may become an issue. For the independent cooling loop systems described above in relation to FIGS. 2 and 3, these considerations are eliminated.

Additionally, although each of the embodiments described above in regards to FIGS. 1-5 are directed to liquid-based cooling systems, alternative cooling systems, such as heat pipes and conduction means, can be used.

Fundamental to the operation of the independent cooling loops system described above is the thermal interface formed between the rejector plate of the electronics server and the chassis cold plate of the server rack. These cooling systems provide mechanisms and form factors for bringing a heat exchanger from the rack into thermal contact with a heat exchanger from the electronics server. For low thermal resistance, a thermal interface material (TIM), such as thermal grease or a thermal pad, may be used. To ensure good thermal contact, pressure is applied between the two heat exchangers, the rejector plate, and the chassis cold plate. The pressure required to hold the heat exchangers can be 20-30 psi or higher. Methods for applying pressure include, but are not limited to, mechanical clamping, springs, electromechanical motors or actuators, pneumatics, and hydraulics. The heat exchangers can take a variety of shapes, including planar, cylindrical, curvilinear, or other non-planar configurations. The mating surfaces of the heat exchangers can be smooth or with physical features such as mating teeth to increase surface area or ensure alignment. Thermal contact can be made on one or more surfaces creating a sandwich-type structure. A heat exchanger can be a single solid piece or can be made up of an array of smaller heat exchangers to allow flexibility when mating non-planar surfaces.

The mounting mechanism used to engage and disengage the heat exchangers is configured to isolate the force applied to the two heat exchangers. The mounting mechanism includes an interlocking mechanism that prevents transfer of the applied force to the rest of the electronics server or rack chassis. Without isolating this force, the force is applied to the electronics server and/or the rack chassis, possibly disconnecting the electrical connections between the electronics server and the rack, as well as providing mechanical stress to the electronics server and/or the rack chassis. The mounting mechanism can also be coupled to the electronics server locking mechanism such that the action of locking the electronics server into the rack causes the heat exchangers to engage in thermal contact. This is a fail-safe procedure since no separate process is required to engage the electronics server cooling loop. Similarly, unlocking the electronics server causes the heat exchangers to disengage allowing the electronics to be removed without interference from either the electronics server cooling loop or the rack cooling loop.

Figure 4:
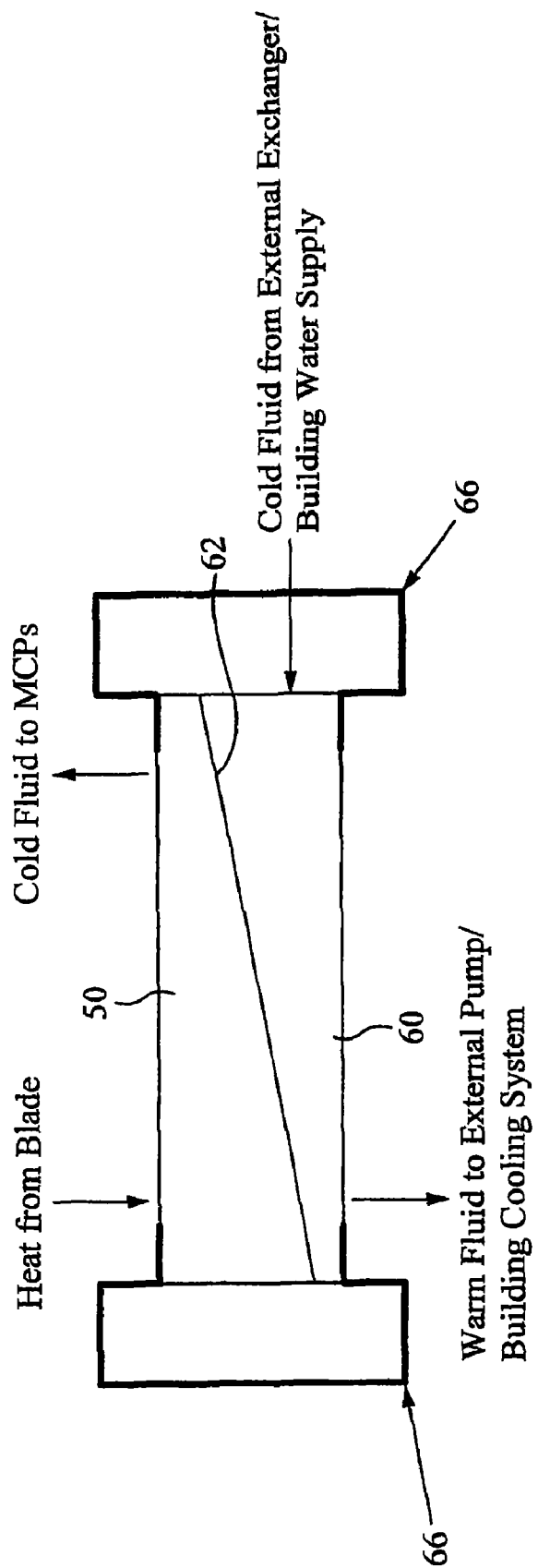
FIG. 4 illustrates an exemplary heat transfer configuration between a mating surface of the rejector plate and a mating surface of the chassis cold plate.

FIG. 4 illustrates an embodiment of a heat transfer configuration between a mating surface of the rejector plate 50 and a mating surface of the chassis cold plate 60 coupled together via the thermal interface material 62. In the configuration shown in FIG. 4, the two mating surfaces of the rejector plate 50 and the chassis cold plate 60 are configured as wedges. A thick portion of the rejector plate wedge 50 is aligned with a thin portion of the chassis cold plate wedge 60. A thin portion of the rejector plate wedge 50 is aligned with a thick portion of the chassis cold plate wedge 60. By sliding the electronics server into the back plane, the wedge shapes cause pressure between the rejector plate wedge 50 and the chassis cold plate 60. This pressure serves to form an enhanced thermal interface. In the first closed loop, heated fluid flows from the MCPs 42 and 44 (FIGS. 2 and 3) to the thick portion of the rejector plate wedge 50. Cooled fluid flows out of the thin portion of the rejector plate wedge 50 to the server pump 40 (FIGS. 2 and 3). In the second closed loop, fluid flows from the liquid-to-air heat exchanging system 70 (FIG. 2), or the external water supply 170 (FIG. 3), to the thick portion of the chassis cold plate wedge 60. Heated fluid flows out of the thin portion of the chassis cold plate 60 to the liquid-to-air heat exchanging system 70 (FIG. 2), or the external water supply 170 (FIG. 3). Each of the rejector plate wedge 50 and the chassis cold plate wedge 60 include channeled features to enable efficient heat transfer from the flowing fluid of the first closed loop, to the wedge interface and/or the flowing fluid of the second closed loop. In alternative embodiments, the rejector plate 50 and the chassis cold plate 60 are configured using dimensions and shapes different than wedges.

A mounting assembly 66 secures the rejector plate wedge 50 to the chassis cold plate 60. The mounting assembly 66 can include clips, screw, or any other conventional retention mechanism.

Figure 6:
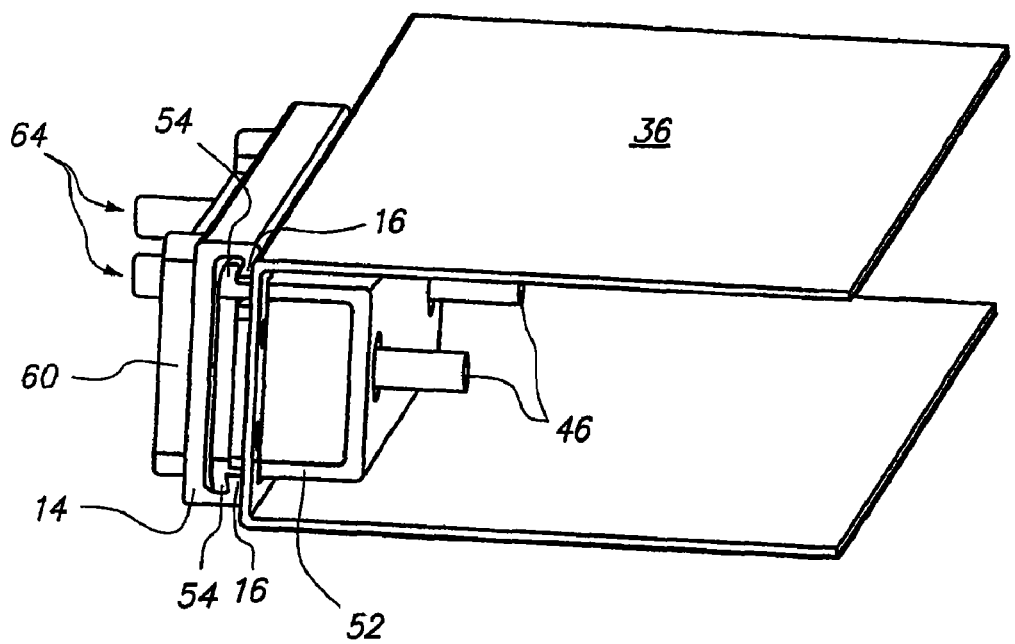
FIG. 6 illustrates a side view of a first mounting assembly used to couple an electronics server to a server rack to form a thermal interface.
Figure 7:
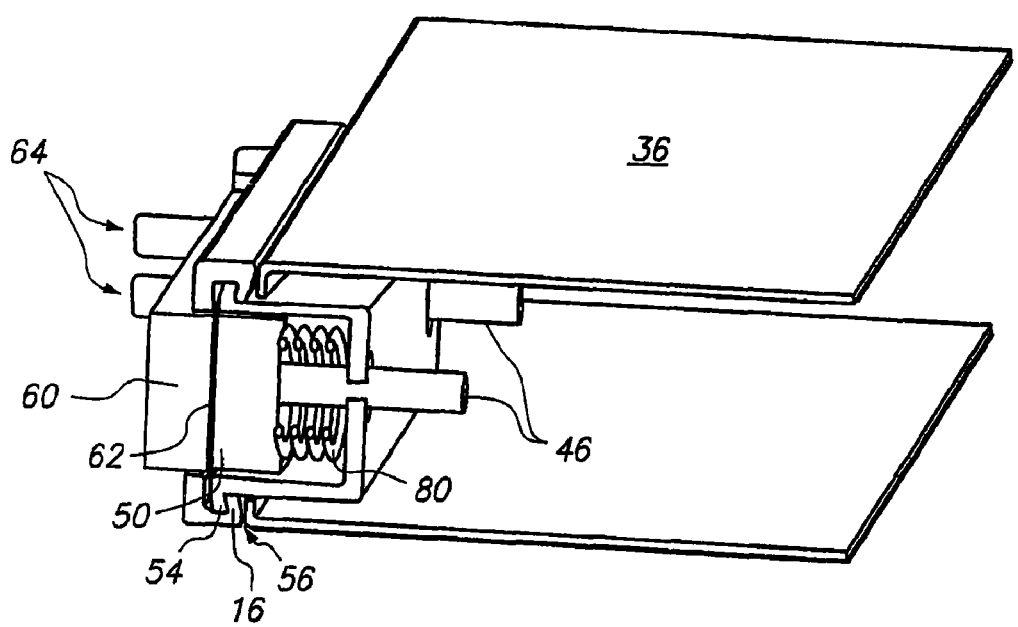
FIG. 7 illustrates a cut-out side view of the mounting assembly from FIG. 6 in an engaged configuration.
Figure 8:
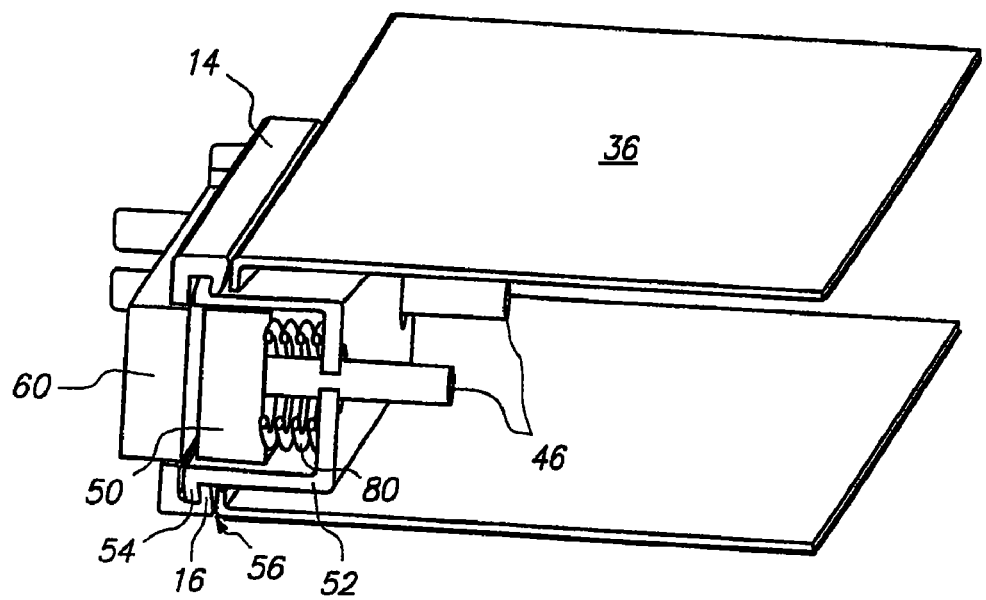
FIG. 8 illustrates a cut-out side view of the mounting assembly from FIG. 6 in a disengaged configuration.

FIGS. 6-8 illustrate one embodiment of a mounting assembly used to engage each electronics server to the server rack. As described above, the thermal interface between the two heat exchangers, the rejector plate of the electronics server, and the chassis cold plate of the rack, is formed by sufficiently forcing the rejector plate against the chassis cold plate, via the thermal interface material, such as TIM 62 (FIG. 4). To prevent transfer of the force to the rest of the electronics server or the rack chassis, an interlocking channel within a mounting assembly is used. The mounting assembly contains the force thus preventing strain from being transferred to the electrical connection on the back plane of the rack or to the components within the electronics server or rack chassis. On the rack side, there is an extruded rack channel, attached to the rack. The rack channel is used as part of the electronics server guide mechanism on the rack. Seated within the rack channel are the rack side heat exchanger and the chassis cold plate.

Attached to a side of the electronics server chassis is a complementary extruded structure, referred to as a chassis guide, which is configured to slide into the rack side-rack channel. Held within the chassis guide are the electronics server rejector plate and one or more springs. The rejector plate is held in a recessed position via a retracting mechanism. To install the electronics server into the rack, the chassis guide slides into the rack channel. After the rack locks are activated to seat the electronics server in the rack and lock the electronics server in place, the retracting mechanism releases the rejector plate allowing the springs to push the rejector plate against the chassis cold plate, thereby providing the pressure required to form the thermal interface.

In particular, FIG. 6 illustrates a side view of the mounting assembly used to couple an electronics server to a server rack to form a thermal interface. FIG. 7 illustrates a cut-out side view of the mounting assembly from FIG. 6 in an engaged configuration. FIG. 8 illustrates a cut-out side view of the mounting assembly from FIG. 6 in a disengaged configuration. The views shown in FIGS. 6-8 do not show the entire electronics server 34 (FIG. 2). Instead, only a portion of an electronics server chassis 36, the inlet and outlet fluid lines 46, and the rejector plate 50 are shown. A chassis guide 52 is configured to extend through a side of the electronics server chassis 36. The chassis guide 52 is also configured to house the rejector plate 50 and springs 80. A rack channel 14 is coupled to the rack (not shown) and is configured around the chassis cold plate 60. The rack channel 14 includes extrusions 16, and the chassis guide 52 includes extrusions 54. The extrusions 16 and the extrusions 54 are configured to dovetail with each other to form an interlocking channel. The force applied to the rejector plate 50 and the chassis cold plate 60 by the springs 80 is applied within the rack channel 14 and the chassis guide 52. Because the extrusions 54 are free-floating relative to the electronics server chassis 36, the force is constrained within the mounting assembly, and the force is not transferred outside the assembly to the electronics server 34 or to the back plane 20 (FIG. 1). By applying the force to the two cold plates, a complimentary reaction force is also generated. This reaction force is contained within the mounting assembly. Without the mounting assembly, the reaction force is applied to the electronics server and possibly, depending on the location of the interface, to the back plane of the rack via the electrical connections. This can negatively impact the system by disrupting the electrical interface between the electronics server and the rack.

The chassis guide 52 is floating relative to the electronics server chassis 36, configured as a float area 56 (FIG. 7) between the interlocking channel and the electronics server chassis 36. The float area 56 enables movement of the chassis guide 52 relative to the electronics server chassis 36. This clearance is used to enable the chassis guide 52 to be loaded into the rack channel 14 as the electronics server 34 is installed in the rack. Once the electronics server 34 is loaded into the rack, and the chassis guide 52 and the rack channel 14 slide together, the retracting mechanism is disengaged and the spring 80 forces the rejector plate 50 against the chassis cold plate 60, as shown in FIG. 7. In contrast, FIG. 8 illustrates the mounting assembly while the retracting mechanism is engaged. In this configuration, the mounting assembly is disengaged and the rejector plate 50 is not thermally coupled to the chassis cold plate 60.

While the retracting mechanism is disengaged and the spring 80 applies force to the rejector plate 50, the rack channel 14 and the chassis guide 52 expand relative to each other and the corresponding extrusions 54 and 16 thereby engage to form the interlocking channel. The interlocking channel in turn constrains the force within the mounting assembly. The float area 56 takes up whatever small movement of the mounting assembly must occur for this expansion, and therefore the formation of the interlocking channel, to occur. In this manner, the float area 56 enables the chassis guide 52 to slide into the rack channel 14 during installation, and then application of the force to press together the rejector plate 50 and the chassis cold plate 60, (thereby forming the thermal interface).

Alternatively, a float area can be configured at a position other than between the electronics server chassis and the rack channel. For example, a float area can be positioned between the rack chassis and the rack channel on the rack side of the mounting assembly. In general, a float is positioned somewhere in the mounting assembly to enable clearance between the chassis guide and the rack channel during installation and removal of the electronics server into and from the rack.

Figure 9:
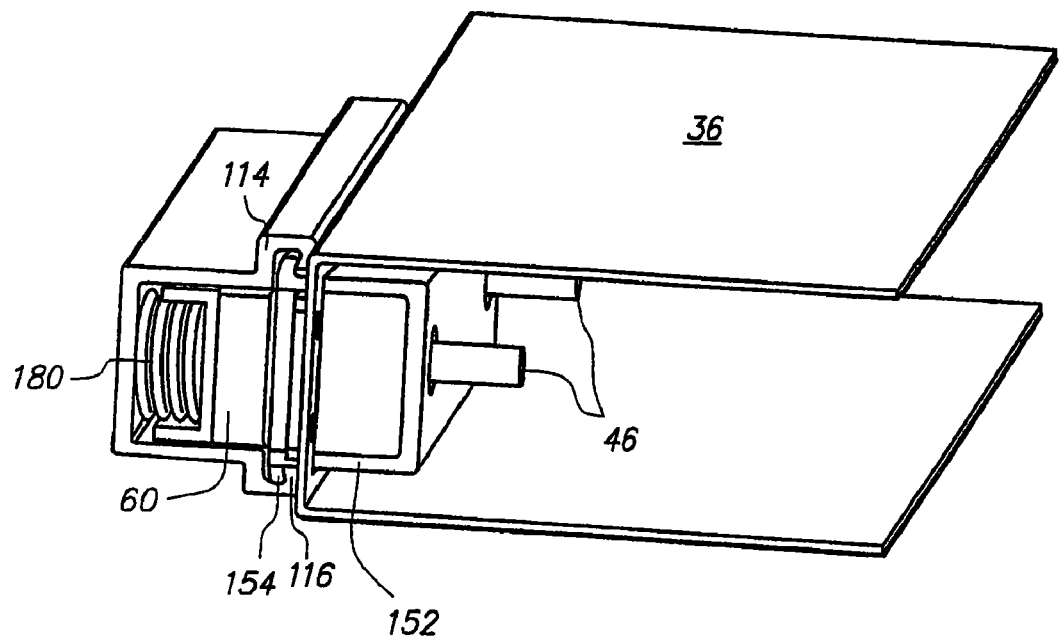
FIG. 9 illustrates a side view of a second mounting assembly used to couple an electronics server to a server rack to form a thermal interface.
Figure 10:
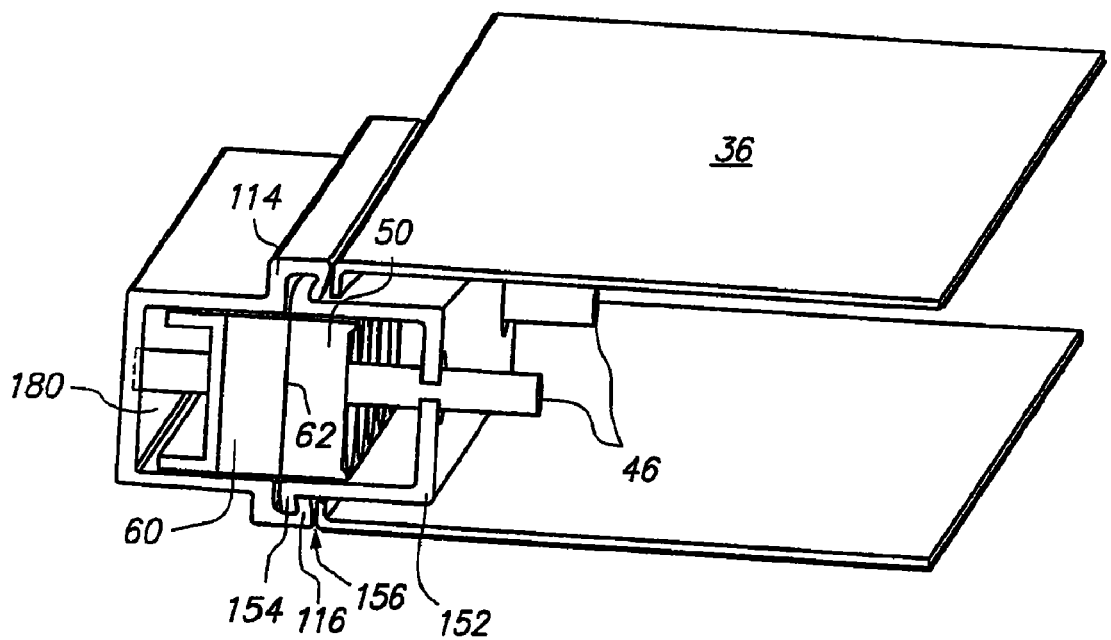
FIG. 10 illustrates a cut-out side view of the mounting assembly from FIG. 9 in an engaged configuration.
Figure 11:
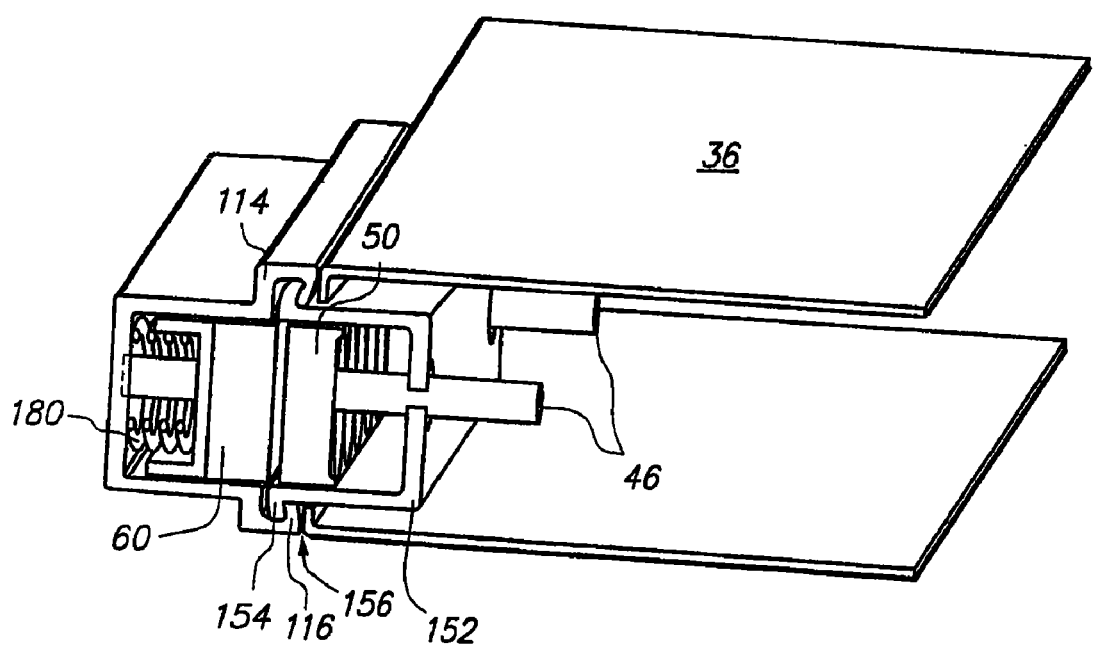
FIG. 11 illustrates a cut-out side view of the mounting assembly from FIG. 9 in a disengaged configuration.

FIGS. 9-11 illustrate another embodiment of a mounting assembly used to engage each electronics server to the server rack. The mounting assembly shown in FIGS. 9-11 is similar to that of the mounting assembly of FIGS. 6-8 except that the rack side-rack channel is made deeper and springs are added behind the chassis cold plate within the rack channel instead of behind the rejector plate in the chassis guide. In some embodiments, the chassis cold plate is held in place by shoulder screws from behind so that the springs are pre-loaded. When the electronics server is inserted into the rack, an actuating mechanism translates, or forces, the rejector plate against the chassis cold plate, via the intervening thermal interface material. The last portion of movement by the rejector plate causes the springs to compress by a corresponding amount, thereby applying the force to form the thermal interface between the rejector plate and the chassis cold plate. Such a configuration enables easy removal of the electronics server from the rack because deactivation of the mounting assembly does not oppose a spring force.

In particular, FIG. 9 illustrates a side view of the mounting assembly used to couple an electronics server to a server rack to form a thermal interface. FIG. 10 illustrates a cut-out side view of the mounting assembly from FIG. 9 in an engaged configuration. FIG. 11 illustrates a cut-out side view of the mounting assembly from FIG. 9 in a disengaged configuration. A chassis guide 152 is configured to extend through a side of the electronics server chassis 36. The chassis guide 152 is also configured to house the rejector plate 50. A rack channel 114 is coupled to the rack (not shown). The rack channel 114 is configured to house the chassis cold plate 60 and springs 180. The rack channel 114 includes extrusions 116, and the chassis guide 152 includes extrusions 154. The extrusions 116 and the extrusions 154 are configured to dovetail with each other to form an interlocking channel. The force applied to the rejector plate 50 and the chassis cold plate 60 by the springs 180 is applied within the rack channel 114 and the chassis guide 152. Because the extrusions 154 are free-floating relative to the electronics server chassis 36, the force is constrained within the mounting assembly, and the force is not transferred outside the assembly to the electronics server 34 or to the back plane 20 (FIG. 1).

The chassis guide 152 is floating relative to the electronics server chassis 36, configured as a float area 156 (FIG. 10) between the interlocking channel and the electronics server chassis 36. The float area 156 enables movement of the chassis guide 152 relative to the electronics server chassis 36. This clearance is used to enable the chassis guide 152 to be loaded into the rack channel 114 as the electronics server 34 is installed in the rack. The float area 156 and the interlocking channel formed by the extrusions 154 and 116 are formed and are operated similarly to the float area 56 and the interlocking channel formed by the extrusions 54 and 16 described above related to FIGS. 6-8.

The chassis cold plate 60 is held in place by shoulder screws (not shown) from behind so that the springs are pre-loaded. In this manner, the chassis cold plate 60 maintains a fixed, outward extending position when not acted upon. This fixed position is shown in FIG. 11. As the electronics server 34 is loaded into the rack, and the chassis guide 152 and the rack channel 114 slide together, a translation mechanism (not shown) forces the rejector plate 50 towards and against the chassis cold plate 60, via the intervening TIM 62, as shown in FIG. 10. The last portion of movement by the rejector plate 50 causes the springs 180 to compress by a corresponding amount, thereby forming the thermal interface between the rejector plate 50 and the chassis cold plate 60. In contrast, FIG. 11 illustrates the mounting assembly while the translation mechanism is disengaged. In this configuration, the chassis cold plate 60 is positioned at its un-actuated position and the rejector plate 50 is not forced by the translation mechanism. As such, the rejector plate 50 is not thermally coupled to the chassis cold plate 60.

Although the mounting assemblies described in relation to FIG. 6-11 include a spring to apply the force to the rejector plate, any conventional means can be used, including but not limited to alternative spring means, pneumatics, mechanical clamping, and hydraulics.

Any number of translation mechanisms can be employed to create the necessary translation of the rejector plate and the chassis cold plate for full engagement. One method is through the use of horizontal or vertical cams. These allow the conversion of a rotational motion to a linear motion. The cams can be further attached to a linear mechanical linkage providing the conversion of a motion in the x-direction to a motion in the y-axis. The shape of the cams can be custom tailored to allow for different styles of translation. For example, if identically shaped cams are used, the rejector plate is uniformly moved in parallel relative to the side of the chassis cold plate. If slightly different shaped cams are used, a progressive motion is made such that one edge of the rejector plate moves forward toward the chassis cold plate, then the other edge of the rejector plate moves. This is useful when disengaging the system and trying to break free a TIM joint.

Figure 12:
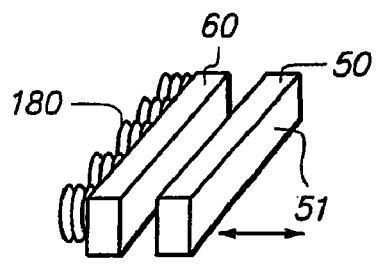
FIG. 12 illustrates a perspective view of the rejector plate and the chassis cold plate within the mounting assembly of FIGS. 9-11.
Figure 13A:
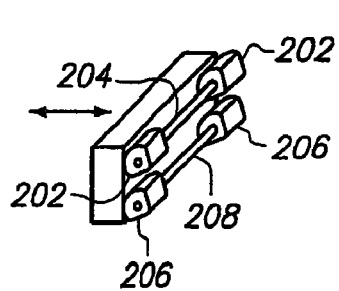
FIG. 13A illustrates a perspective view of a first embodiment of a horizontal cam configuration.
Figure 13B:
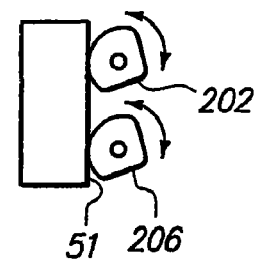
FIG. 13B illustrates a side view of the first embodiment of the horizontal cam configuration of FIG. 13A.

FIG. 12 illustrates a perspective view of the rejector plate and the chassis cold plate within the mounting assembly of FIGS. 9-11. As shown in FIG. 12, the rejector plate 50 is moved in the horizontal direction. Moving the rejector plate 50 from right to left engages the thermal interface. Moving the rejector plate 50 from left to right disengages the thermal interface. One or more cams can be coupled to a back surface 51 of the rejector plate 50. FIG. 13A illustrates a perspective view of a first embodiment of a horizontal cam configuration. Multiple cams 202 are positioned horizontally against the back surface 51. The cams 202 are coupled via a linkage 204. Multiple cams 206 are positioned horizontally against the back surface 51. The cams 206 are coupled via a linkage 208. FIG. 13B illustrates a side view of the first embodiment of the horizontal cam configuration of FIG. 13A. The shape of the cams 202 and 206 determine translation of the rejector plate 50 from side to side or from top to bottom. The shape and orientation of the cams 202 relative to the cams 206 determines the translation of the top side of the rejector plate 50 relative to the bottom side. If the cams 202 and the cams 206 are shaped and oriented the same, then the entire rejector plate 50 moves uniformly. If the cams 202 and the cams 206 are not shaped or oriented the same, then one side of the rejector plate 50 moves differently than the other side. It is understood that more than two cams 202 can be used and/or more than two cams 206 can be used. It is also understood that more than two rows of cams can be used.

Figure 14A:
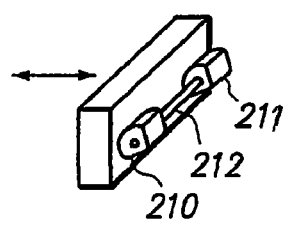
FIG. 14A illustrates a perspective view of a second embodiment of a horizontal cam configuration.
Figure 14B:
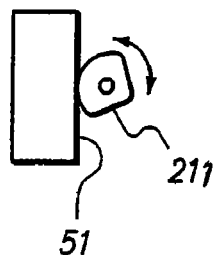
FIG. 14B illustrates a side view of the second embodiment of the horizontal cam configuration of FIG. 14A.

FIG. 14A illustrates a perspective view of a second embodiment of a horizontal cam configuration. Multiple cams 211 are positioned horizontally against the middle of the back surface 51. The cams 211 are coupled via a linkage 212. FIG. 14B illustrates a side view of the second embodiment of the horizontal cam configuration of FIG. 14A. The shape of the cams 211 determines translation of the rejector plate 50. The shape and orientation of each of the cams 211 relative to each other determines the translation of the side portion of the rejector plate 50 relative to the other side. If the cams 211 are each shaped and oriented the same, then the entire rejector plate 50 moves uniformly. If the cams 211 are not shaped or oriented the same, then one side of the rejector plate 50 moves differently than the other side. It is understood that more than two cams 211 can be used.

Figure 15A:
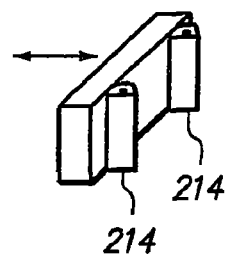
FIG. 15A illustrates a perspective view of a first embodiment of a vertical cam configuration.
Figure 15B:
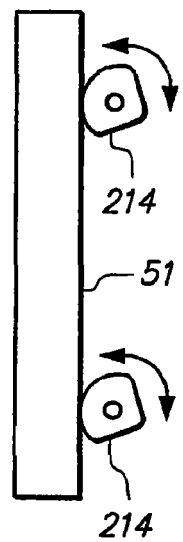
FIG. 15B illustrates a top-down view of the first embodiment of the vertical cam configuration of FIG. 15A.

FIG. 15A illustrates a perspective view of a first embodiment of a vertical cam configuration. Multiple cams 214 are positioned vertically against the back surface 51. FIG. 15B illustrates a top-down view of the first embodiment of the vertical cam configuration of FIG. 15A. The shape of the cams 214 determines translation of the rejector plate 50 from side to side. The shape and orientation of each of the cams 214 determines the translation of one side of the rejector plate 50 relative to the other side. If the cams 214 are shaped and oriented the same, then the entire rejector plate 50 moves uniformly. If the cams 214 are not shaped or oriented the same, then one side of the rejector plate 50 moves differently than the other side. It is understood that more than two cams 214 can be used.

Figure 16A:
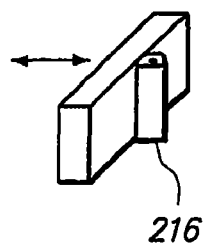
FIG. 16A illustrates a perspective view of a second embodiment of a vertical cam configuration.
Figure 16B:
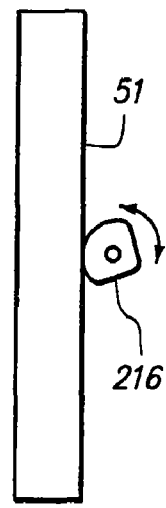
FIG. 16B illustrates a top-down view of the second embodiment of the vertical cam configuration of FIG. 16A.

FIG. 16A illustrates a perspective view of a second embodiment of a vertical cam configuration. A single cam 216 is positioned vertically against the middle of the back surface 51. This allows the pressure between the rejector plate 50 and the chassis cold plate 60 to self-balance, as the force is applied at a single point on the back of the rejector plate 50. FIG. 16B illustrates a top-down view of the second embodiment of the vertical cam configuration of FIG. 16A. The shape of the cam 216 determines translation of the rejector plate 50.

As applied to FIGS. 12-16B, the cams move the rejector plate 50 from right to left, toward the chassis cold plate 60. However, the cams do not retract the rejector plate 50 from the chassis cold plate 60. To retract the rejector plate from 50 from the chassis cold plate 60, one or more springs (not shown) are attached to the back surface 51 of the rejector plate 50. As such, to move the rejector plate 50 toward the chassis cold plate 60, the cams must overcome the spring force of the attached spring. To move the rejector plate 50 away from the chassis cold plate 60, the cams are disengaged by rotating them to their initial positions. In response, the spring pulls the rejector plate 50 away from the chassis cold plate 60, for example, from left to right in the FIGS. 12-16B. Without the spring attached to the back surface 51, when the cams are disengaged, the rejector plate 50 is not subject to any translation force.

Although not shown in FIGS. 12-16B, the cams can be coupled to a common linkage assembly. The common linkage assembly, such as an actuating rod, is used to actuate the cams. The linkage assembly can be manually operated. The linkage assembly can also be coupled to the electronics server locking mechanism used to lock the electronics server into the rack when the electronics server is installed. In this manner, the cams are actuated concurrently with the rack locking mechanism such that the action of locking the electronics server into the rack causes the rejector plate and the chassis cold plate to engage in thermal contact.

Another translation mechanism uses ramp profiles. The back surface of the rejector plate is configured with ramp profiles. Alternatively, the ramp profiles are separate components that are attached to the rejector plate. These ramp profiles mate with translating ramps or rollers positioned against the chassis guide. The use of rollers provides the advantage of lower friction and thus less force. The ramps or rollers can be individually contoured to provide "progressive" motion, which forces one side of the rejector plate to the chassis cold plate before the other side. This is similar to the cam configuration described above in which individual cams are configured with different shapes or orientations. FIG. 17 illustrates a top-down view of a first ramp translation mechanism. A rejector plate 150 includes one or more ramp profiles 153 along a back surface 151. An actuating mechanism 220 is configured with one or more ramp profiles 222 that mate to the one or more ramp profiles 153. The actuating mechanism is positioned against a fixed surface within the chassis guide 52, such as the inside surface of the chassis guide 52. In some embodiments, the actuating mechanism 220 is fixed relative to the chassis guide 52 such that as the electronics server 34 is installed in the rack, the rejector plate 150 slides along the actuating mechanism 220 such that the ramp profiles 222 slide along the ramp profiles 153, thereby forcing the rejector plate 150 against the chassis cold plate 60. As shown in FIG. 17, the rejector plate 150 is translated from right to left according to this procedure. In other embodiments, the actuating mechanism 220 slides along the chassis guide 52. After the electronics server 34 is installed in the rack, a separate step is performed in which the actuating mechanism 220 is moved along the chassis guide. For example, from top to bottom in FIG. 17, such that the ramp profiles 222 slide along the ramp profiles 153, thereby forcing the rejector plate 150 against the chassis cold plate 60. This step can be automatically performed as part of a locking procedure used to lock the electronics server 34 into the rack, or this step can be manually performed after the locking procedure.

FIG. 18 illustrates a top-down view of a second ramp translation mechanism. The second ramp translation mechanism functions similarly to the first ramp translation mechanism with the exception that the ramp profiles 222 on the actuating mechanism are replaced by rollers. In particular, an actuating mechanism 230 is configured with one or more rollers 232 that mate to the one or more ramp profiles 153. The actuating mechanism is positioned against a fixed surface, such as the inside surface of the chassis guide 52. The rollers 232 reduce the friction against the ramp profiles 153. In some embodiments, the actuating mechanism 230 is fixed relative to the chassis guide 52. In other embodiments, the actuating mechanism 230 slides along the chassis guide 52. Alternative slides 234 can also be used to further reduce the friction generated when moving the actuating mechanism 230. It is understood that the location of the ramps and the rollers can be reversed while achieving the same effect. As with the cam configurations, use of the first and second ramp translation mechanisms requires a retracting means for disengaging the rejector plate 150 from the chassis cold plate 60. Spring means similar to that described above in relation to the cam configurations can be included in either the first or second ramp translation mechanisms.

Another translation mechanism used is a scissor jack positioned between the rejector plate and a fixed surface within the chassis guide. FIG. 19 illustrates a top-down view of a scissor jack translation mechanism. A scissor jack 242 is positioned between the back surface 51 of the rejector plate 50 and a fixed surface within the chassis guide 52, such as the inside surface of the chassis guide 52. An actuating rod 240 is coupled to open and close the scissor jack 242. For example, as applied to FIG. 19, upward movement of the actuating rod 240 opens the scissor jack 242, and downward movement of the actuating rod 240 closes the scissor jack 242. The scissor jack 242 can be held in place within the chassis guide 52 by an alternative support 244. In some embodiments, the actuating rod 240 is automatically actuated as part of the locking procedure used to lock the electronics server 34 into the rack. In other embodiments, the actuating rod 240 is moved independently of the locking procedure. As with the cam configurations: use of the first and second ramp translation mechanisms requires a retracting means for disengaging the rejector plate 50 from the chassis cold plate 60. Spring means similar to that described above in relation to the cam configurations can be included in the scissor jack translation mechanism. Alternatively, the scissor jack can be configured to provide the retraction force.

Figure 20A:
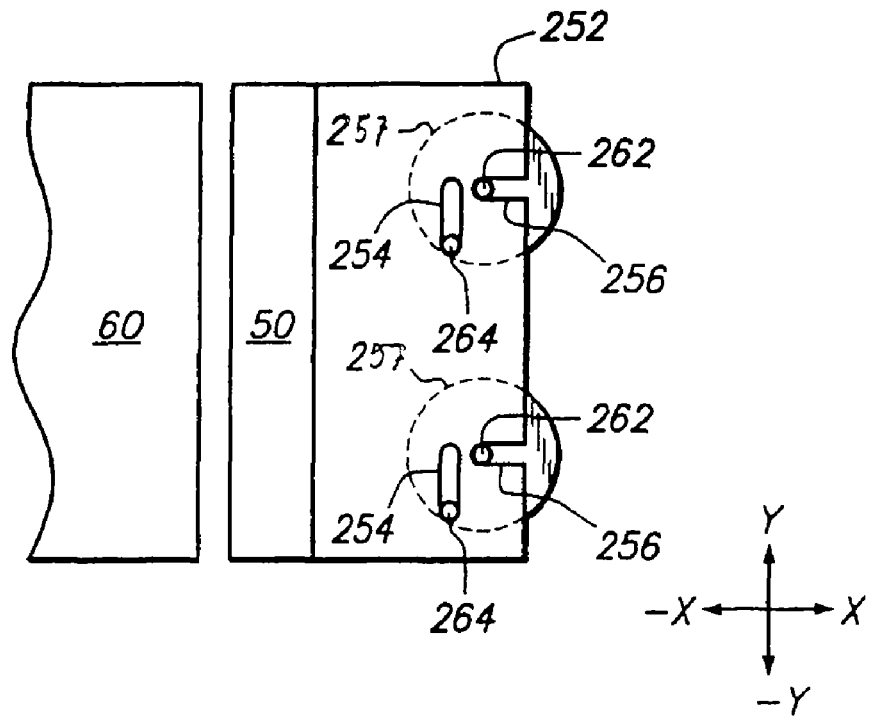
FIG. 20A illustrates a top-down view of an exemplary embodiment of the translation mechanism using cams, slots, and pins in a disengaged position.
Figure 20B:
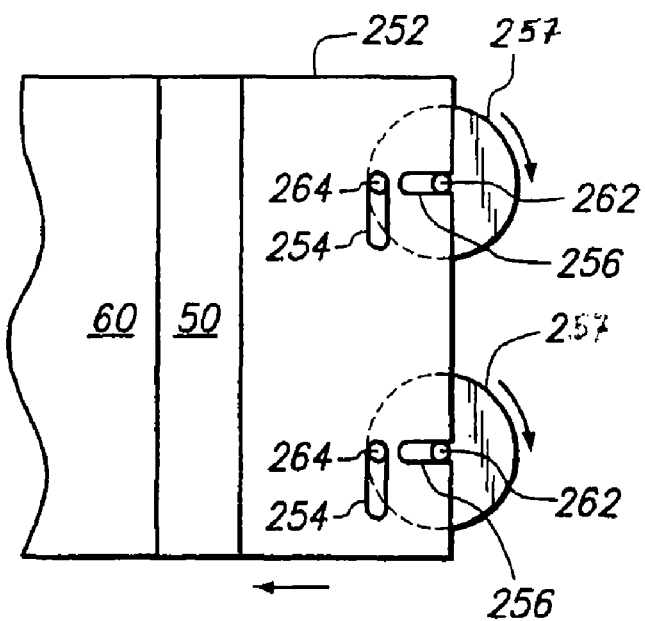
FIG. 20B illustrates a top-down view of the translation mechanism of FIG. 20A in an engaged position.

Another translation mechanism uses cams in combination with slots and pins. Rotational movement of the cams is converted to linear movement of the rejector plate. This translation mechanism is used to move the rejector plate to engage the chassis cold plate, and to move the rejector plate to disengage from the chassis cold plate. FIG. 20A illustrates a top-down view of an exemplary embodiment of the translation mechanism using cams, slots, and pins in a disengaged position. In the disengaged position, the rejector plate 50 is disengaged from the chassis cold plate 60. A cold plate extension 252 is attached to the rejector plate 50. One or more cams 257 are coupled to the chassis guide 52 (FIG. 9) at a center position 262. The cams 257 are free to rotate about the center position 262, but are otherwise linearly fixed relative to the chassis guide 52. The center position 262 is positioned within a center slot 256 of the cold plate extension 252. Each cam 257 includes a pin 264 that extends perpendicularly from a surface of the cam. The pin 264 fits within a pin slot 254 of the cold plate extension 252. As the cam 257 rotates clockwise, the pin 264 is forced along the pin slot 254 in the y-direction (upward relative to FIG. 20A), which generates a linear force in the x-direction. This linear force moves the cold plate extension 252, and therefore, the rejector plate 50, in the x-direction to engage the chassis cold plate 60, as illustrated in FIG. 20B.

To disengage the rejector plate 50 from the chassis cold plate 60, the cams 257 are rotated counterclockwise. Counterclockwise rotation of the cams 257 forces the pin 264 along the pin slot 254 in the y-direction (downward relative to FIG. 20A), which generates a linear force in the x-direction. This linear force moves the cold plate extension 252, and therefore the rejector plate 50, in the x-direction to disengage the chassis cold plate 60, as illustrated in FIG. 20A. Each of the cams 257 can be linked together via a mechanical linkage (not shown). In some embodiments, the mechanical linkage is automatically actuated as part of the locking procedure used to lock the electronics server 34 into the rack. In other embodiments, the mechanical linkage is moved independently of the locking procedure. It is understood that alternative configurations to the one shown in FIGS. 20A and 20B are also contemplated. For example, the profile of the pin slot 254 is shown in FIGS. 20A and 20B as a straight line in the y-direction, which results in a substantially linear conversion of rotational movement to linear movement. This profile can be adjusted, thereby altering the mechanical force profile applied to the rejector plate.

Figure 21A:
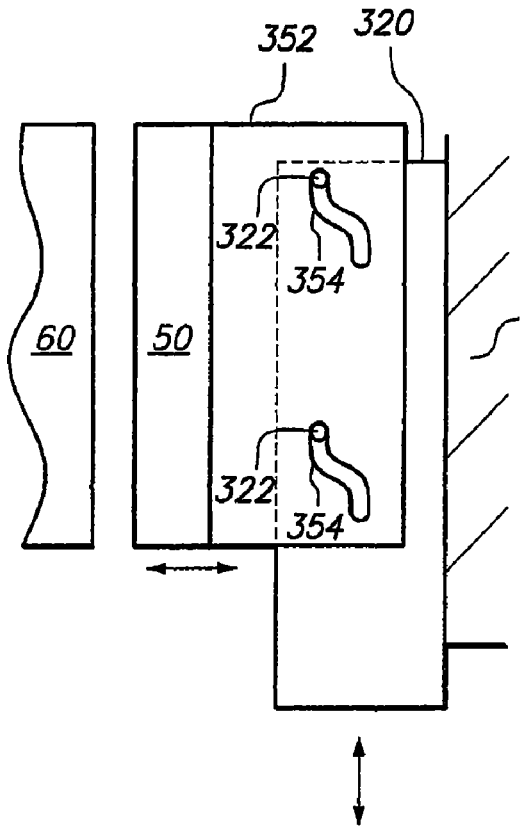
FIG. 21A illustrates a top-down view of an exemplary embodiment of the translation mechanism using slots and pins in a disengaged position.
Figure 21B:
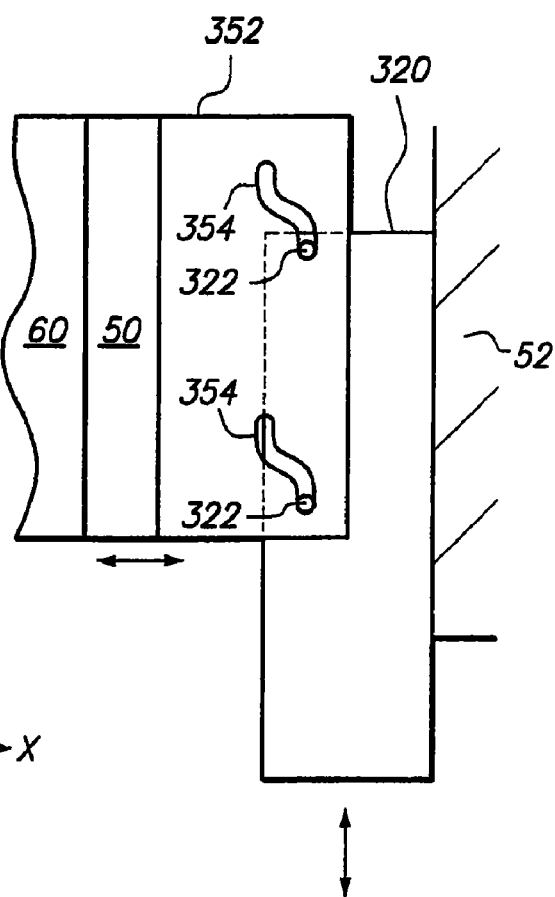
FIG. 21B illustrates a top-down view of the translation mechanism of FIG. 21A in an engaged position.
Figure 21C:
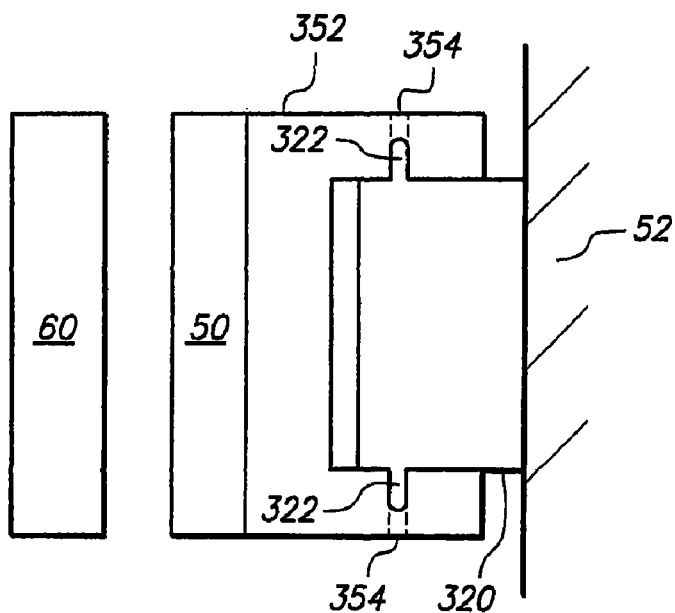
FIG. 21C illustrates a side view of the exemplary translation mechanism of FIG. 21A.

Another translation mechanism uses a combination of pins and slots with slot profiles. A linear motion in a first direction is translated to a linear motion in a second direction, preferably perpendicular to the first direction. This translation mechanism uses appropriately shaped slots to cause the rejector plate to engage the chassis cold plate. FIG. 21A illustrates a top-down view of an exemplary embodiment of the translation mechanism using slots and pins in a disengaged position. FIG. 21C illustrates a side view of the exemplary translation mechanism of FIG. 21A. In the disengaged position, the rejector plate 50 is disengaged from the chassis cold plate 60. A cold plate extension 352 is attached to the rejector plate 50. The cold plate extension 352 includes one or more slots 354. An actuating rod 320 includes one or more pins 322 that extend perpendicularly from a surface of the actuating rod. Each pin 322 fits into one of the slots 354 of the cold plate extension 352. The actuating rod 320 slides back and forth in the y-direction, but is fixed in the x-direction. As the actuating rod 320 moves in the y-direction, the pins 322 move within the slots 354. Linear movement of the activating rod 320 in the y-direction is converted to linear movement of the cold plate extension 352, and therefore the attached rejector plate 50, depending on the slot profile of the slots 354. The slot profiles of each slot 354 can be the same, or different, depending on the required motion of the rejector plate 50. Varying the slot profile provides mechanical variations in the force applied to the rejector plate 50. According to the configuration in FIGS. 21A and 21B, as the actuating rod 320 is moved in the y-direction, the rejector plate 50 is uniformly moved in the x-direction to engage the chassis cold plate 60, as shown in FIG. 21B. FIG. 21C illustrates a side view of the exemplary translation mechanism of FIG. 21A. In relation to FIG. 21C, the actuating rod 320 moves perpendicular to the page.

To disengage the rejector plate 50 from the chassis cold plate 60, the actuating rod 320 is moved in the y-direction. In some embodiments, the actuating rod 320 is automatically actuated as part of the locking procedure used to lock the electronics server 34 into the rack. In other embodiments, the actuating rod 320 is moved independently of the locking procedure. It is understood that alternative configurations to the one shown in FIGS. 21A and 21B are also contemplated.

Figure 22:
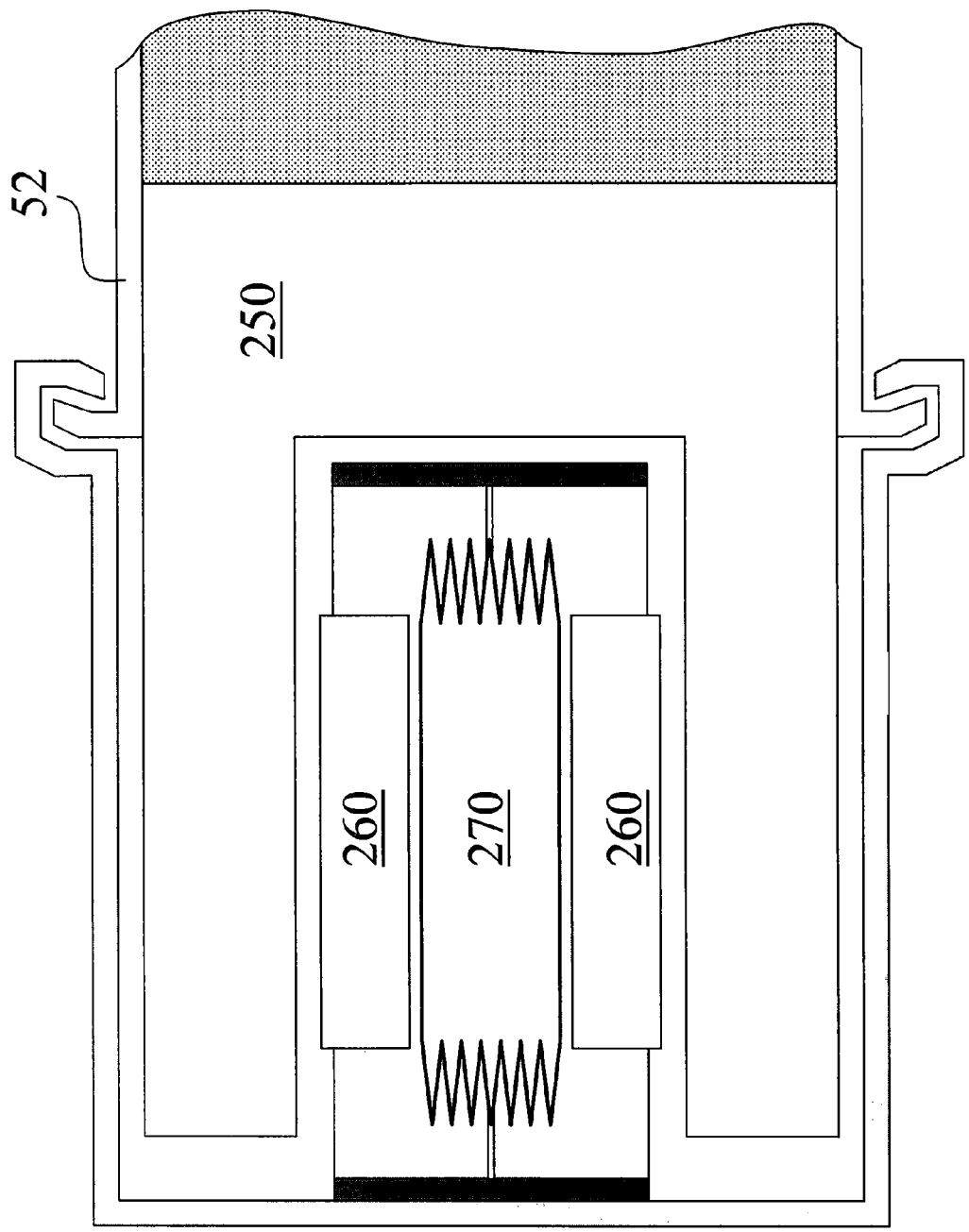
FIG. 22 illustrates an alternative configuration of the chassis cold plate and rejector plate.

FIGS. 22-25 illustrate an alternative configuration of the chassis cold plate and server rejector plate, involving the use of a planar thermal interface. The server rejector plate 250 is configured as U-shaped into which can fit two chassis cold plates 260, as shown in FIG. 22. An expansion mechanism 270 is positioned between the chassis cold plates 260. Examples of the expansion mechanism 270 include, but are not limited to, a bellows or a bladder. The expansion mechanism 270 can also be any one of the previously described actuation means, or a variation thereof. As the expansion mechanism 270 expands against the chassis cold plates 260, the chassis cold plates are engaged to the server rejector plate 250. The configuration described above may optionally include an alignment or force containment assembly 52 (as shown in FIG. 22).

In FIG. 23A, a top view of an exemplary cooling system for use with the thermal interface assemblies described in FIGS. 22-32 is shown. In accordance with the present disclosure, the cooling system 10 comprises a rack, frame, or other containment assembly 15, having at least two parallel and spaced apart sides 11a and 11b, and back wall 11c, forming a generally U-shaped frame structure 15 which electronics servers 30, which may be CPU modules, servers, and the like, may slide into and out of, as illustrated by the directional arrow. The cooling system 10 also comprises a coolant fluid distribution rail 280, as well as one or more heat exchangers (alternatively referred to herein as chassis cold plates), or HEXs 260, and at least one server rejector plate or server rejector heat exchanger 250, which as seen in further figures herein is generally U-shaped. While the server rejector is shown as U-shaped and the chassis cold plate as fitting within this U-shape, the two components are not limited to this arrangement and it may be advantageous to have the chassis cold plate in a U-shaped configuration, wherein the server rejector plate would fit within the U-shaped configuration of the chassis cold plate. Typically, HEXs 260 are in removable, interconnected fluid communication with the coolant distribution rail 280, allowing the heat generated by electronics servers 30 during operation within rack 15 to be cooled by circulating refrigerant or other coolant, as described previously, wherein heat from the devices housed within the server is picked up in a circulating loop, carried to the rejector plate of the server to the interface, where the heat load is then picked up by the chassis cold plate and rejected to an ambient environment, as described above. FIG. 23B illustrates a top view of an alternative exemplary cooling system 10' of the present disclosure suitable for use with thermal interface assemblies as described in FIGS. 6-21, comprising a rack, frame, or other containment assembly 15', having at least two parallel and spaced apart sides 11a and 11b, and back wall 11c, forming a generally U-shaped frame structure 15' which electronics servers 30, which may be CPU modules, servers, and the like, may slide into and out of, as illustrated by the directional arrow. The cooling system 10' of FIG. 23B also comprises one or more refrigerant distribution rails 280, one or more heat exchangers (alternatively referred to herein as chassis cold plates), or HEXs 260, and at least one server rejector plate or server rejector heat exchanger 250. As illustrated in this alternative arrangement, the refrigerant distribution rail 280 and the chassis cold plates 260 may be interconnected by one or more sets of flex lines 253, allowing within the assembly 15' for varied placement, dimensional tolerances, or positional adjustment, and the like, using bellows, cams, or other expansion mechanisms as previously described.

Turning to FIG. 24A, an alternative planar, thermal interface similar to that illustrated in FIG. 22 is shown in a frontal view. As illustrated therein, the system comprises a bellows-type expansion assembly 272 which is spaced intermediate between chassis cold plates 260a and 260b, and is engageable with support frame 13 on at least one side. Support frame 13, which is affixed to the rack frame 15, acts to retain the bellows assembly 272 and the chassis cold plates 260a, 260b in place, so that they can be inserted in a U-shaped server rejection heat exchanger or the like. Similar to the thermal interfaces described above, the bellows-type expansion assembly 272 is located, at least in part, within the interior portion of a generally U-shaped server rejection heat exchanger (HEX) 250, which in turn is associated, directly or indirectly, with electronics server 30. As is also shown in FIG. 24A, and in contrast to the expansion assembly 270 illustrated in FIG. 22, the bellows-type expansion assembly 272 comprises a narrow, central region 273, intermediate between the chassis cold plates 260a and 260b, and spaced apart, external bellows edges 273a and 273b. Thus, in the relaxed state, the engagement assembly 272 is located such that the narrow, central region 273 of assembly 272 is located in between chassis cold plates 260a and 260b, as shown. Chassis cold plates 260a and 260b, along with the support frame 13, are also spaced such that there are top and bottom air gaps 261, and side clearance gap 263, between each chassis cold plate 260a and 260b and the bottom/top surface of the server rejection heat exchanger 250, and between the support frame 13 and the inner side surface of server rejection heat exchanger 250. The clearance gaps 261 and 263 allow the chassis cold plates 260a and 260b, the support frame 13, and the bellows expansion assembly 272 together to slide relative to the server rejection heat exchanger 250 without contact during insertion of the server into the rack. During a typical operation of the thermal interface, as the bellows-type expansion assembly 272 expands in the direction of the arrows, the narrow central region 273 intermediate between chassis cold plates 260a and 260b expands in the direction of the server rejection heat exchanger 250 accordingly, decreasing the air gaps 261, and in doing so forces the chassis cold plates 260a and 260b to make or nearly make surface contact with the server rejection heat exchanger (HEX) 250. The contact, via surfaces 259 and 269 of the server rejection heat exchanger and chassis cold plates, respectively, allow the operational heat from the electronics servers 30 to be drawn away from the servers by way of the refrigerant or other coolant flowing within the chassis cold plates 260a and 260b. For clarity of the drawings, not shown is thermal interface material (similar to 62) that could optionally lie between heat exchanger contact surfaces 259 and 269, so as to improve heat transfer between the surfaces.

In FIG. 24B, a front view is shown of a further, exemplary planar thermal interface assembly having a different bellows-type arrangement than that illustrated in FIG. 24A. As illustrated, and similar to the assembly of FIG. 24A, the system comprises a bellows-type expansion assembly 275 which is spaced intermediate between chassis cold plates 260a and 260b (such as cold plates for heat rejection), and is engageable with support frame 13 on at least one side. Support frame 13, which is affixed to the rack frame 15, acts to retain the bellows assembly 275 and the chassis cold plates 260a, 260b in place, so that they can be inserted in a U-shaped server rejection heat exchanger or the like. Similar to the thermal interfaces described above with reference to the assembly of FIG. 24A, the bellows-type expansion assembly 275 is located, at least in part, within the interior portion of a generally U-shaped server heat rejection heat exchanger (HEX) 250, which in turn is associated, directly or indirectly, with electronics server 30. As is also shown in FIG. 24B, the bellows-type expansion assembly 275 comprises at least a central, expandable region 276, intermediate between the chassis cold plates 260a and 260b, and spaced apart, external bellows edges 276a and 276b. Chassis cold plates 260a and 260b, along with the support frame 13, are also spaced such that there are top and bottom air gaps 261, and side clearance air gap 263, between each chassis cold plate 260a and 260b and the bottom/top surface of the server rejection heat exchanger 250, and between the support frame 13 and the inner side surface of server rejection heat exchanger 250. The clearance gaps 261 and 263 allow the chassis cold plates 260*a* and 260*b*, the support frame 13, and the bellows expansion assembly 275 together to slide relative to the server rejection heat exchanger 250 without contact during insertion of the server into the rack. During a typical operation of the thermal interface, the central expandable bellows region 276 expands in the direction of the arrows, and chassis cold plates 260*a* and 260*b* move toward the server rejection heat exchanger 250 accordingly. The air gaps 261 are thus decreased, and the chassis cold plates 260*a* and 260*b* are forced to make or nearly make surface contact with the server rejection heat exchanger (HEX) 250. The contact, via surfaces 259 and 269 of the server rejection heat exchanger and chassis cold plates, respectively, allow the operational heat from the electronics servers 30 to be drawn away from the servers by way of refrigerant or other coolant flowing within the chassis cold plates 260*a* and 260*b*. This contact and transfer of heat energy, similar to that described in association with FIG. 24A, results in a thermal/mechanical interconnection when bellows 275 are pushed apart. For clarity of the drawings, not shown is an optional thermal interface material (similar to 62) that may be inserted between heat exchanger contact surfaces 259 and 269, so as to improve heat transfer between the surfaces.

Figure 25:
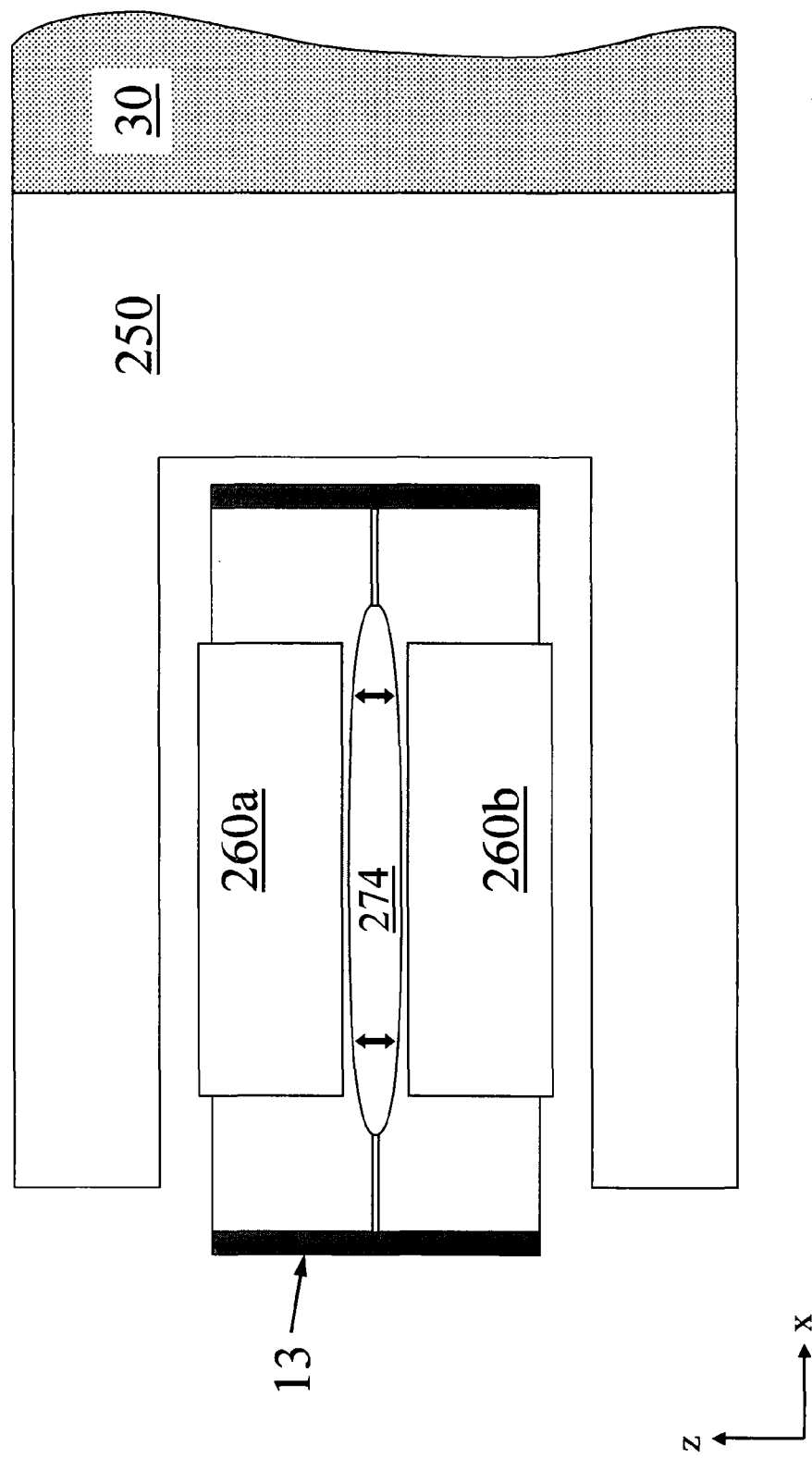
FIG. 25 illustrates a front view of a third exemplary planar thermal interface with a third exemplary bellows in a compressed state.

FIG. 25 illustrates a front view of yet another configuration for the general planar-type of cooling system illustrated in FIG. 22, incorporating the use of a bladder-type expansion mechanism 274 (versus the previously-discussed bellows-type mechanism) spaced intermediate between chassis cold plates 260*a* and 260*b*. As also shown in FIG. 25, the server rejection HEX 250 is configured as a generally U-shaped structure, and each electronics server 30 is configured to mate with two chassis cold plate heat exchangers, 260*a* and 260*b*. The chassis cold plates 260*a* and 260*b* are preferably aligned within the U-shaped heat rejector plate 250, as shown in FIG. 25. The bladder-type expansion mechanism 274 is preferably positioned intermediate between the chassis cold plates 260*a* and 260*b*. During typical operation, the bladder-type expansion mechanism 274 expands against the two chassis cold plates 260*a* and 260*b*, and in doing so forces the chassis cold plates 260*a* and 260*b* to make or nearly make surface contact with the server rejection heat exchanger (HEX) 250. The engagement between chassis cold plates and server rejection heat exchangers allows the operational heat from the electronics servers 30 to be drawn away from the servers by way of the refrigerant or other coolant circulating through the chassis cold plates 260*a* and 260*b*. While it has generally been shown in FIGS. 22, 23A, 23B, 24A, 24B and 25 that an expansion mechanism is placed between a pair of chassis cold plates, it is equally acceptable to have an expansion mechanism that acts against a single chassis cold plate and one surface of the server rejection heat exchanger.

Figure 26:
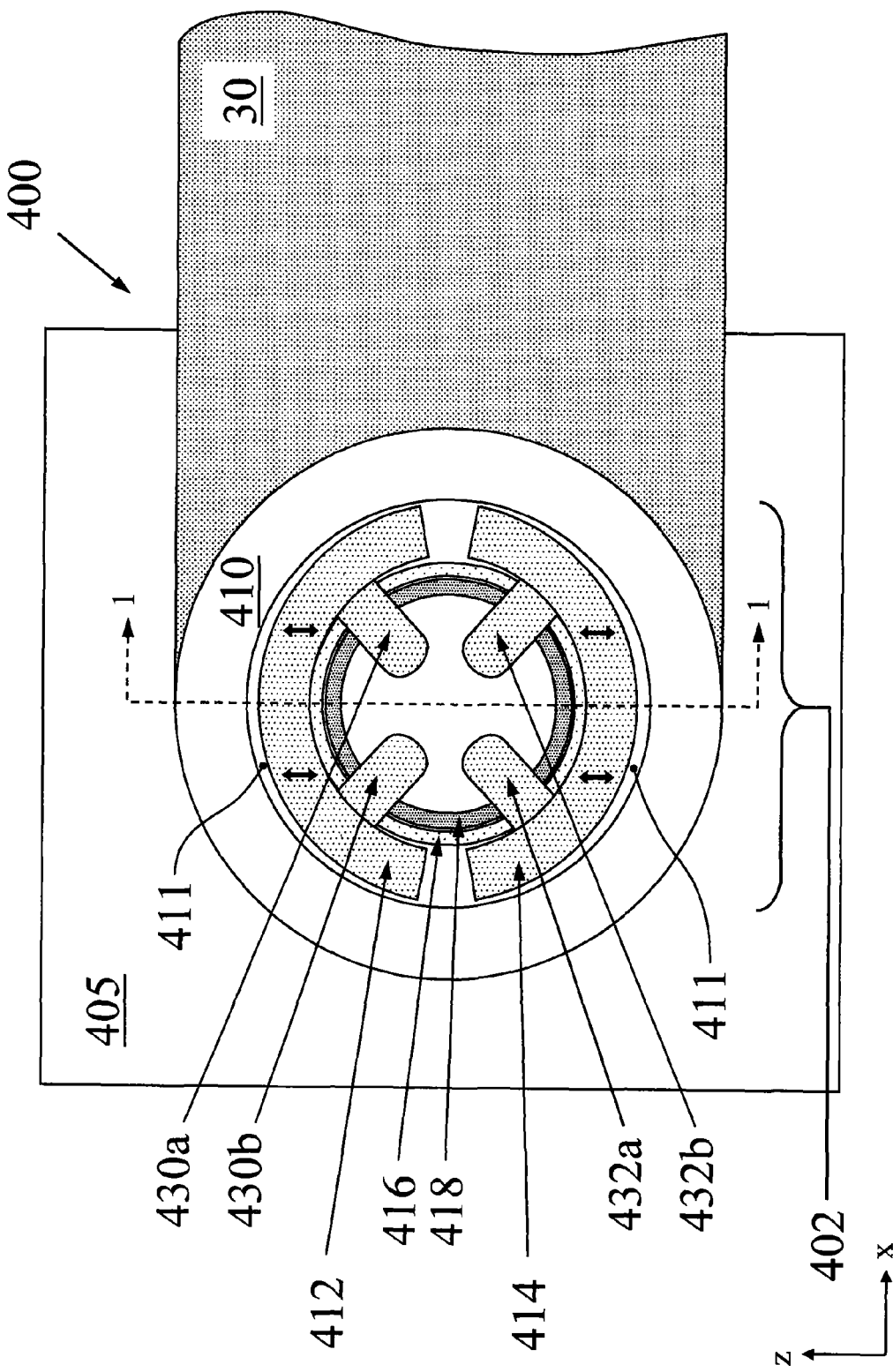
FIG. 26 illustrates a front view of an exemplary cylindrical thermal interface.

FIGS. 26-30 illustrate further, alternative configurations of a chassis cold plate and heat rejector plate in a server/CPU rack-type cooling system, involving the use of cylindrical thermal interfaces. FIG. 26 illustrates a front view of a first cylindrical thermal interface assembly 400. The cylindrical interface assembly 400 comprises a substantially annular server rejection heat exchanger 410 which rejects heat from server 30 by way of thermal conveyance, either thermal conduction, fluid circulation, or the like as earlier depicted in FIGS. 1 and 2. Substantially concentrically interior to server heat exchanger 410, lies a substantially cylindrical heat exchanger assembly 402 which provides thermal conveyance connectivity between electronics server 30 within a rack assembly 15 and a refrigerant distribution rail 405, which is manufactured to accommodate assembly 402 as will be further described herein. Cylindrical heat exchanger (HEX) assembly 402 attaches to distribution rail 405 via an appropriate attachment means, and comprises one or more substantially hemi-annular, or annular sector, heat exchangers (alternatively referred to herein as chassis cold plates), 412 and 414, an annular bladder-type expansion means 416, and an inner support tube 418. The assembly 402 further comprises one or more fluid inlet supply lines 430*a* and 432*a* and one or more fluid outlet return lines 430*b* and 432*b* associated with the chassis cold plates 412 and 414. Chassis cold plates 412 and 414 may be served by independent cooling loops, or may be served by a single cooling loop, as appropriate to the needs of circuit redundancy and complexity. The annular bladder expansion means 416 is depicted in FIG. 26 in a substantially relaxed state allowing clearance gaps 411 between the server rejection heat exchanger 410 and the chassis cold plates 412 and 414. The clearance gaps 411 allow the assembly 402 to slide relative to the server rejection heat exchanger 410 without contact during insertion of the server into the rack. During typical operation, the annular bladder-type expansion mechanism 416 expands against the support tube 418 and the two chassis cold plates 412 and 414, and in doing so moves the chassis cold plates 412 and 414 in the direction of the arrows to reduce clearance gaps 411 and thereby to make or nearly make surface contact with the server rejection heat exchanger 410. The engagement between chassis cold plates and server rejection heat exchangers allows the operational heat from the electronics servers 30 to be drawn away from the servers by way of refrigerant or similar coolant circulating through the chassis cold plates 412 and 414. For clarity of the drawings, not shown is an optional thermal interface material (similar to 62) that may be inserted between heat exchanger contact surfaces so as to improve heat transfer between the mating surfaces. Springs, bands, or other retraction devices, not shown, or deflation and evacuation of the annular bladder, serve to retract the chassis cold plates 412, 414 from the server rejection heat exchanger 410 and to restore clearance gaps 411 when the server is to be removed from the rack 15. While it is illustrated in FIG. 26 that the inlet supply lines 430*a*, 432*a* and the fluid outlet lines 430*b*, 432*b* are rotationally symmetric about the center of assembly 402, it is envisioned (without limitation) that the these fluid supply and return lines may alternatively be symmetric about an x-y plane, such that lines 430*a* and 432*b* are fluid inlet lines, and lines 430*b* and 432*a* are fluid return lines. Further, the assembly 402 may be rotated about its center so that engagement is via a motion in substantially the x-axis direction rather than the z-axis direction as depicted, or may be rotated to any preferred angle relative to the server orientation.

Figure 27:
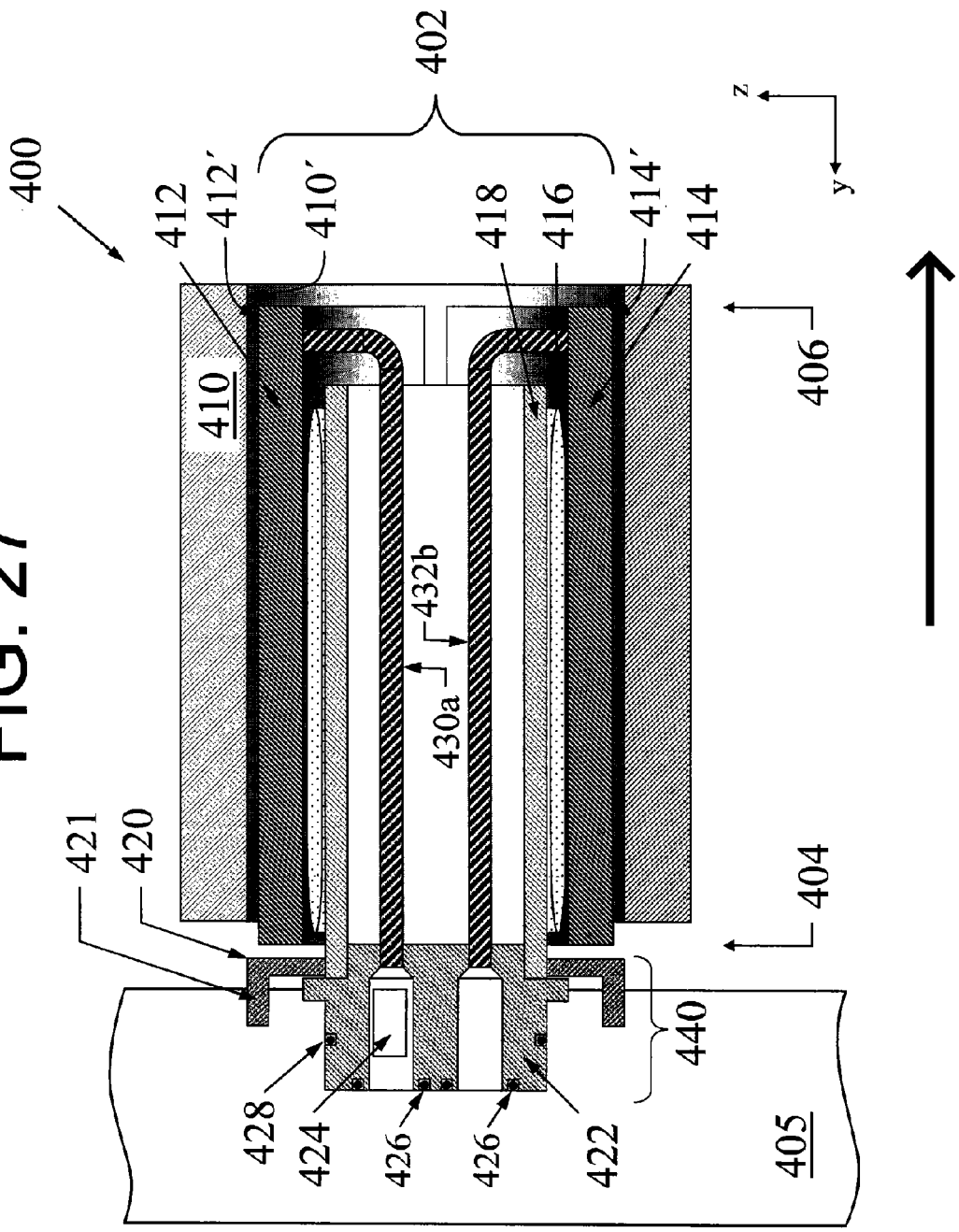
FIG. 27 illustrates a cross-sectional side view of the cylindrical thermal interface of FIG. 26.

FIG. 27 illustrates a side-view of the cylindrical thermal interface assembly 400 of FIG. 26, in cross-section, as viewed along the section line 1-1 of FIG. 26. As shown in FIG. 27, cylindrical heat exchanger assembly 402 further comprises a proximal end 404 and a distal end 406, wherein the proximal end provides fluid communication with the refrigerant fluid distribution rail 405 within a rack assembly 15. This view also illustrates that the fluid supply and return lines 430*a* and 432*b*, respectively, typically extend from the proximal end 404, substantially the length of the cylindrical interface assembly 402, and connect with the chassis cold plate heat exchangers 412 and 414 near the distal end 406. Fluid enters the distal end 406 of chassis cold plate heat exchangers 412, 414, and flows internally through to the proximal end 404 and returns to the distal end 406, and in both passes along the length of the chassis cold plates the circulating fluid provides heat transfer in the interior of the cylindrical exchangers 412 and 414. By thermal conduction, the cylindrical exchangers 412 and 414 in turn provide heat transfer on their outer surface 412' and 414' in contact with the interior surface of cylindrical server rejection heat exchanger 410. In accordance with the present disclosure, fluid supply and return lines 430a, 430b, 432a, 432b are preferably comprised of a flexible material, so that when the bladder 416 is engaged, the HEX's 412, 414 are able to move evenly up to their point of thermal contact. Proximal end 404 may comprise an engagement assembly 440 comprising a lock ring 420 and a fluid communication linkage assembly 422. Lock ring 420 may engage distribution rail 405 by lockably inserting into an appropriately-spaced groove, or may be attached via threadable engagement, wherein the lips 421 are threaded so as to engage in matching threads (not shown) within distribution rail 405. Distribution rail 405 includes fluid supply and return passages, not shown, that mate with corresponding inlet and outlet ports of engagement assembly 440 to supply coolant to and receive coolant from, respectively, cylindrical interface assembly 402. The fluid communication assembly 440 may be any shape, but is preferably circular or square, and includes at least one flow regulator 424. Preferably, communication linkage assembly 422 comprises a number of fluid ports containing flow regulators 424 equal to the number of refrigerant supply lines 430a, 432a supplying chassis cold plate heat exchangers to regulate coolant flow to each chassis cold plate. Alternatively, flow regulators may be placed in series in the refrigerant return lines, 430b, 432b, or both supply and return lines, depending on the application. As also shown in FIG. 27, the assembly 440 also comprises a number of O-rings, such as port O-rings 426 circumscribing each of the fluid ports in fluid communication assembly 422, and one or more backup O-ring 428 which circumscribes the outer region of assembly 422 in manners known in the art, such as by fitting within a formed groove in the outer surface of assembly 422 as illustrated in the figure. These O-rings serve to make the linkages and the assembly leak tight under normal operation and failed port ring operation, respectively. In accordance with this assembly, heat transfer between the server rejector and the cold plate occurs on the inner surface of 410, surface 410', and on the outer surface of heat exchangers 412, 414, surfaces 412' and 414', respectively.

It should be noted that one may use substantially identical pieces for both the upper and lower hemi-annular heat exchangers 412 and 414, such that there is a rotational symmetry about a central axis through cylindrical heat exchanger assembly 402. Consequently, the fluid supply and return lines within assembly 402 as shown in FIG. 27 may be the same, or may be alternatively oriented—e.g., the upper fluid line 430a may be a supply line, while the lower fluid line 432b may be a fluid return line, as appropriate. Alternatively, for example, planar symmetry of the cylindrical heat exchanger assembly may be used where a mirror plane is formed between the upper and lower hemi-annular heat exchangers, with corresponding changes to the positions of the fluid supply and return lines.

Figure 28:
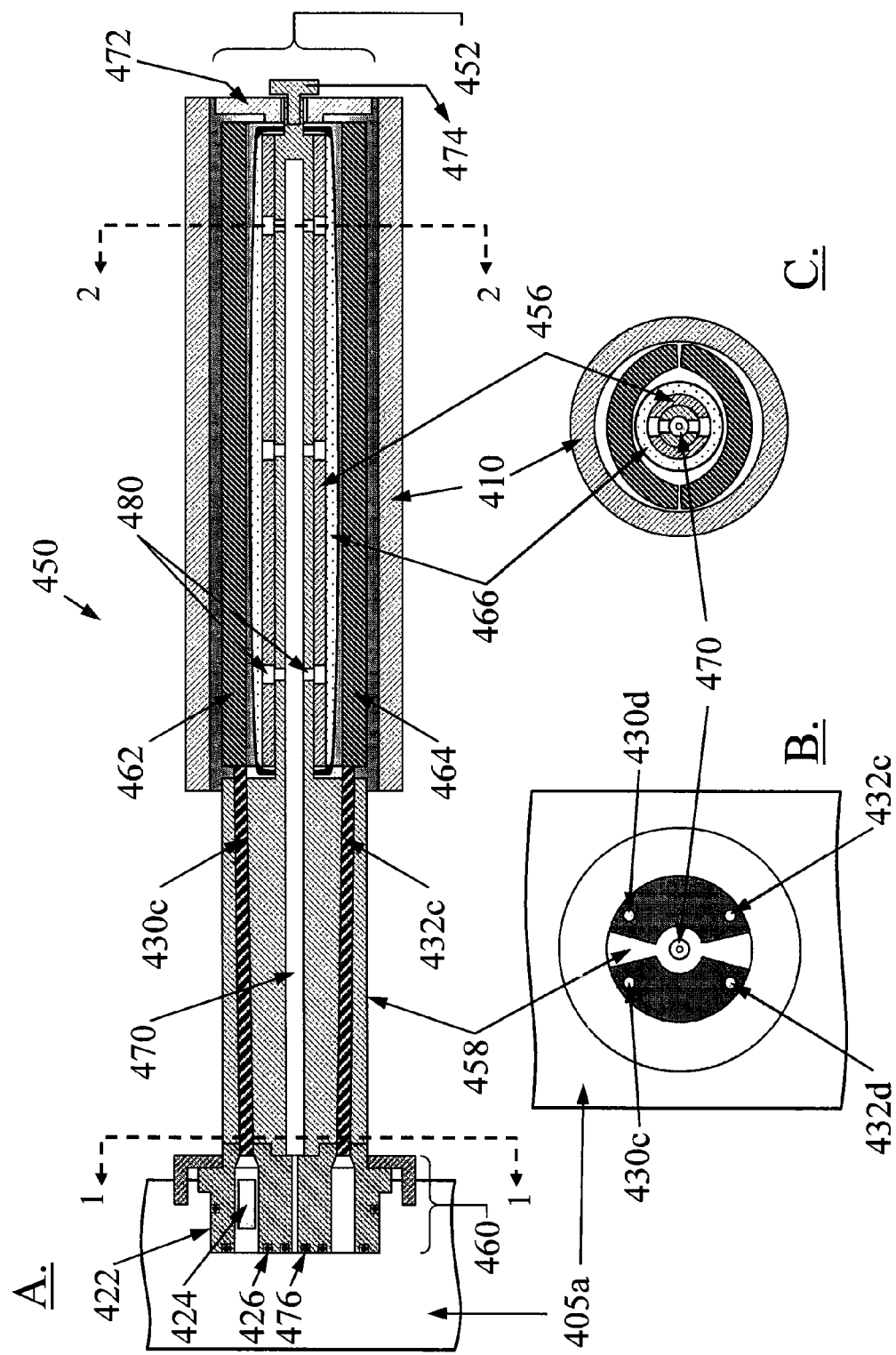
FIG. 28A illustrates a side view of an alternative exemplary cylindrical thermal interface.
FIG. 28B illustrates an end-view of the distribution rail having the cylindrical thermal interface of FIG. 28A attached, taken along line 1-1.
FIG. 28C illustrates a cross-sectional view of the cylindrical thermal interface of FIG. 28A, taken along line 2-2.

An alternative, yet equally acceptable modification of a cylindrical-type thermal interface connector assembly 450 is illustrated in FIGS. 28A-C. FIG. 28 shows the entire assembly in combined cross-section and cut-away section along its length, while FIGS. 28B and 28C show portions of the assembly in perpendicular cross-section at specific locations along its length, with some details below the section plane hidden for clarity of the drawings. As shown therein, thermal interface connector assembly 450 comprises a substantially cylindrical heat exchanger assembly 452 which provides thermal conveyance connectivity between electronics servers within a rack assembly 15 and the refrigerant distribution rail 405a, similar to the methods described above. This aspect comprises a cylindrical server rejection heat exchanger 410, similar to that described above, and chassis cold plates 462 and 464 which are in fluid communication with the distribution rail 405 via flexible fluid supply and return lines 430c and 432d, respectively. Bladder support shaft 458 contains a central pressurizing fluid path 470 central to assembly 452 which acts to transport pressurizing fluid to maintain a substantially constant pressure within bladder 466. The bladder may contain an internal support 456, that may or may not be bonded to the bladder 466, which serves to provide a stiff internal frame for the bladder to facilitate sealing of the bladder at its ends with bladder support shaft 458. Both the bladder support shaft 458 and bladder internal support 456 contain one or more slots or holes by which the bladder can be inflated or deflated via the pressurizing fluid from the central pressurizing fluid path 470. The assembly 452 may be held together with an end cap 472 and a cap nut 474 or an equivalent assembly which threadably engages the bladder support shaft 458 as illustrated, such that when end cap 472 and cap nut 474 are in place, they act in tandem to capture and seal an end of the bladder 466. The assembly 452 is lockably engaged with the distribution rail 405a via a lock-ring or similar attachment means, similar to that shown and described in relation to FIG. 27 herein. At the fluid distribution rail 405a, central pressurizing fluid path 470 is sealed to its pressurizing fluid distribution channel (not shown) via o-ring 476. The embodiments shown in FIGS. 28A-C are substantially similar to those in FIG. 27, such as in the concepts of the interface, the engagement into the distribution rail 405a, and the like, but they also differ from those in FIG. 27 in several manners. First, the bladder design and pressure engagement are different, as is apparent from both the figures and the associated description. In addition, the fluid communication lines 430c and 432d in FIGS. 28A-B connect to the proximal end of the chassis cold plates 462 and 464. FIG. 28B is a frontal view taken along line 1-1 of FIG. 28A, and illustrates a preferred shape of the bladder support shaft 458 near the engagement assembly 460 connection to the distribution rail 405. The coolant fluid supply and return lines 430c, 432c, and 430d, 432d provide interconnecting, fluid linkage between the each of the heat exchangers 462 and 464 and the engagement assembly 460. The engagement assembly mates to corresponding coolant fluid supply and return lines (not shown) in the distribution rail 405 to direct fluid to and from chassis cold plates 462 and 464.

FIG. 28C is a section view of the portion of cylindrical heat exchanger assembly 450 taken along line 2-2, showing a cross-section of the assembly and illustrating an exemplary setup. As shown therein, cylindrical server rejection heat exchanger 410 circumscribes the two substantially hemi-annular chassis cold plate heat exchangers 462 and 464 (equivalent to 412 and 414, above), which in turn circumscribe central bladder 466, and which contains a support structure suitable for maintaining the relative positions of the exchanger components. Similar to that described in FIG. 27, inflation of the bladder 466 forces the chassis cold plate heat exchangers 462 and 464 in proximal contact with the server rejection heat exchanger 410 to effect heat exchange between the components, which may optionally be facilitated with thermal interface material (similar to 62, not shown).

Figure 29:
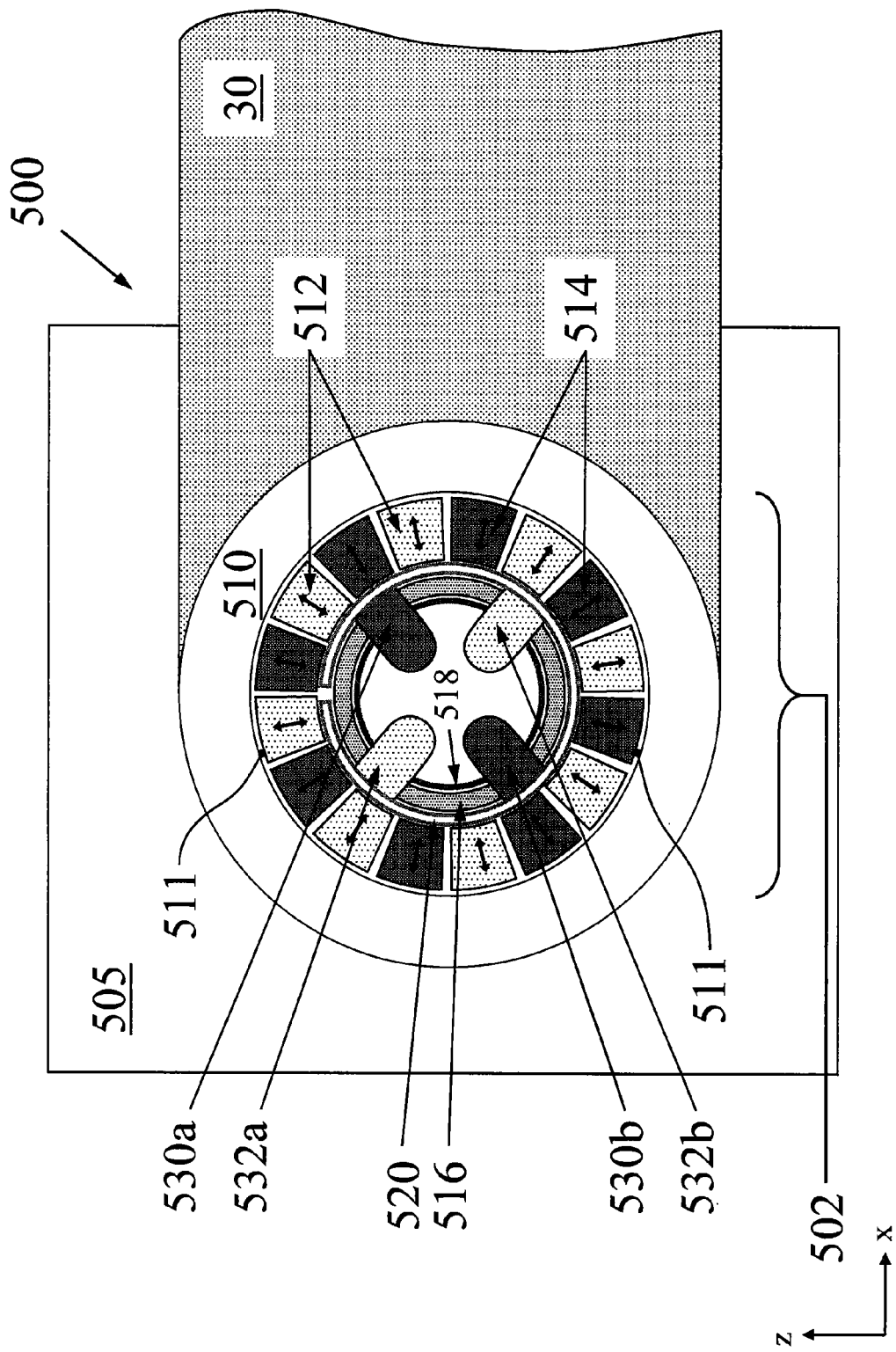
FIG. 29 illustrates a frontal view of an exemplary alternative multi-segmented cylindrical thermal interface.
Figure 30:
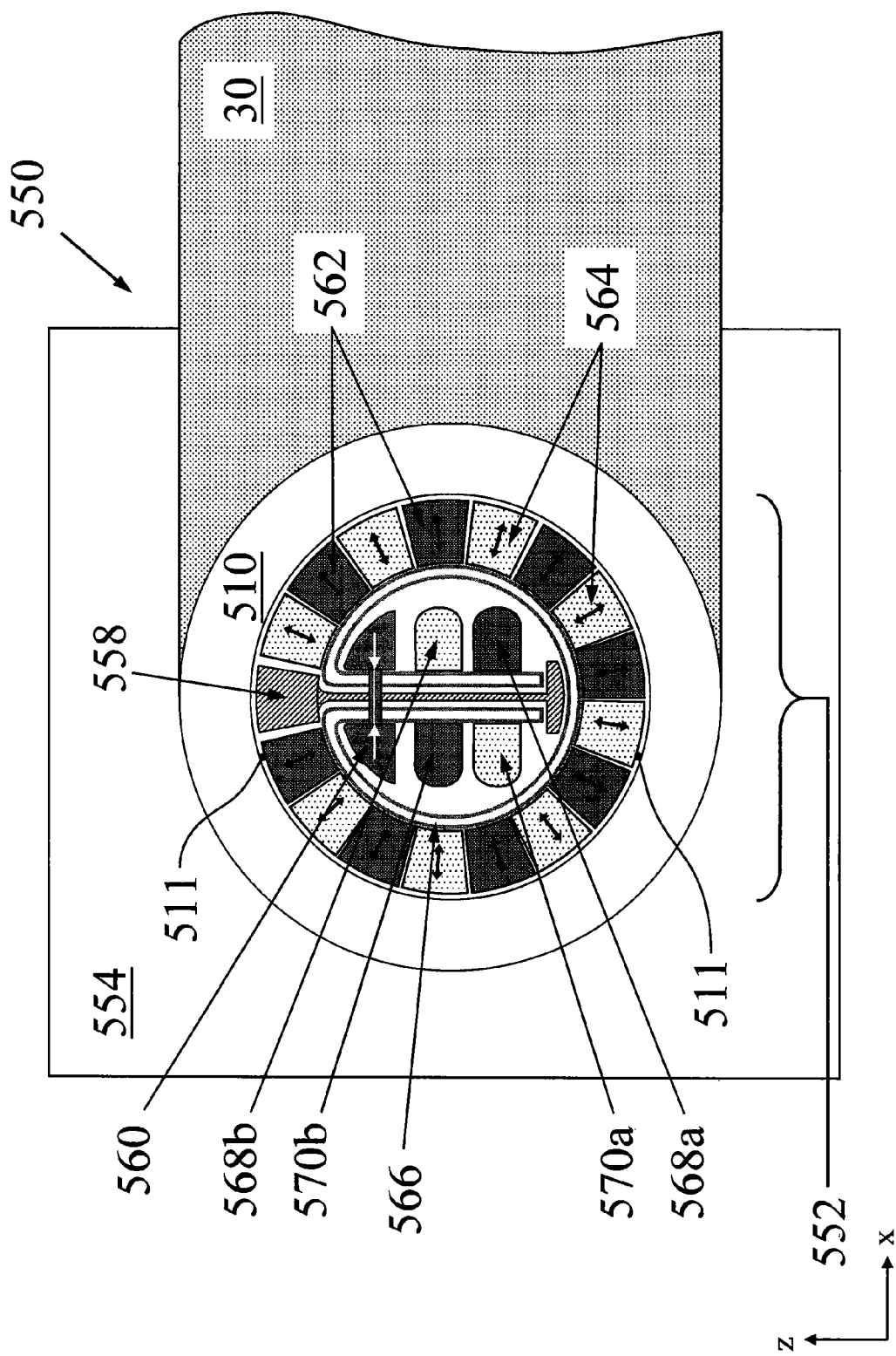
FIG. 30 illustrates a frontal view of an exemplary alternative cylindrical thermal interface with exemplary alternative engagement means.

FIGS. 29 and 30 illustrate further alternative cylinder type thermal interface heat exchanger assemblies 500 and 550 suitable for use in accordance with the present disclosure, comprising laminate manifolds 520 and 566, bonded to multi-segmented circular-arced chassis cold plates 512 and 514.

Such assemblies may be advantageous for use in server systems such as described herein, compared to those assemblies having two HEXs, in that if orientation of one or more of the segments is slightly off, such mis-orientation will not be a detriment to the overall efficiency of the heat exchanger assembly. FIG. 29 illustrates a frontal view of a cylindrical thermal interface 500 for heat removal from heat-generating components such as high-density servers and switches. The cylindrical interface assembly 500 comprises a substantially annular server rejection heat exchanger 510 which rejects heat from server 30 by way of thermal conveyance, either thermal conduction, fluid circulation, or the like as earlier depicted in FIGS. 1 and 2. Substantially concentrically interior to server heat exchanger 510, lies a substantially cylindrical heat exchanger assembly 502 which provides thermal conveyance connectivity between electronics server 30 within a rack assembly 15 and a refrigerant distribution rail 505, which is manufactured to accommodate assembly 502 as will be further described herein. Cylindrical heat exchanger (HEX) assembly 502 attaches to distribution rail 505 via an appropriate attachment means in a manner previously described herein, and comprises a plurality of annular-sector heat exchangers (alternatively referred to herein as chassis cold plates), 512 and 514, attached to laminate manifold 520 (such as described in more detail with reference to FIGS. 33-34), an annular bladder-type expansion means 516 similar to those previously described herein, and an inner support tube 518. While the arrangement of chassis cold plate heat exchangers is illustrated as an alternating pattern between supply 512 and return 514, they may be arranged in any number of patterns, as appropriate. The assembly 502 further comprises one or more fluid inlet supply lines 530a and 532a and one or more fluid outlet return lines 530b and 532b associated with the chassis cold plates 512 and 514. Chassis cold plates 512 and 514 may be served by independent cooling loops, or may be served by a single cooling loop, as appropriate to the needs of circuit redundancy and complexity. The annular bladder expansion means 516 is depicted in FIG. 29 in a substantially relaxed state allowing clearance gaps 511 between the server rejection heat exchanger 510 and the chassis cold plates 512 and 514. The clearance gaps 511 allow the assembly 502 to slide relative to the server rejection heat exchanger 510 without contact during insertion of the server into the rack. During typical operation, the annular bladder-type expansion mechanism 516 expands against the support tube 518 and the laminate manifold 520, and in doing so moves the multi-segment cold plates 512 and 514 in the direction of the arrows to reduce clearance gaps 511 and thereby to make or nearly make surface contact with the server rejection heat exchanger 510. The engagement between chassis cold plates and server rejection heat exchangers allows the operational heat from the electronics servers 30 to be drawn away from the servers by way of refrigerant or similar coolant circulating through the chassis cold plates 512 and 514. For clarity of the drawings, not shown is an optional thermal interface material (similar to 62) that may be inserted between heat exchanger contact surfaces so as to improve heat transfer between the mating surfaces. Springs, bands, or other retraction devices, not shown, or spring action of the laminate manifold 520, or deflation and evacuation of the annular bladder, serve to retract the chassis cold plates 512, 514 from the server rejection heat exchanger 510 and to restore clearance gaps 511 when the server is to be removed from the rack 15. As can be seen from the figure, the laminate manifold 520 is preferably located intermediate between the chassis cold plates heat exchangers 512 and 514 and the inner, annular-shaped bladder engagement 516, and comprises at least three layers—a first inner fluid connection interface layer, a second, intermediate fluid distribution layer, and a third, outer cold plate segment interface layer. Manifold 520 distributes coolant into the system, and can simultaneously act as a spring to preferentially engage or alternately disengage the outer surfaces of the cold plates against the server rejector heat exchanger 510.

FIG. 30 illustrates a frontal view of cylindrical thermal interface assembly 550 similar to that illustrated in FIG. 29, with the exception of the support/engagement means for the laminate manifold, and the positioning of the coolant supply lines 568a and 570a and coolant return lines 568b and 570b, respectively. Cylindrical heat exchanger (HEX) assembly 552 attaches to distribution rail 554 and comprises an a laminate manifold 566 that simultaneously acts as the manifold portion and cylindrical hex assembly 552 support via support hanger 558, refrigerant delivery lines 568a and 570a, refrigerant return lines 568b and 570b, a pneumatic/electronic engagement/disengagement means 560, and a plurality of chassis cold plate heat exchangers (HEXs) 562 and 564. Coolant is delivered to the chassis cold plate heat exchangers by way of delivery lines 568a and 570a, to the laminate manifold and further through the laminate manifold by way of paths patterned in the laminate layers. Likewise, coolant is removed from the chassis cold plates by way of the manifold and return lines 568b and 570b. As can be seen from the figure, the laminate manifold 520 may be located intermediate between the chassis cold plate heat exchanger elements 562 and 564 and the inner support hanger 558. In typical operation, pneumatic or electronic engagement/disengagement means 560 actuates to expand and contract so that the exterior surfaces of HEXs 562 and 564 are engaged or disengaged, as required with the inner surface of the server rejection heat exchanger 510. For clarity of the drawings, not shown is an optional thermal interface material (similar to 62) that may be inserted between heat exchanger contact surfaces so as to improve heat transfer between the mating surfaces.

Figure 31:
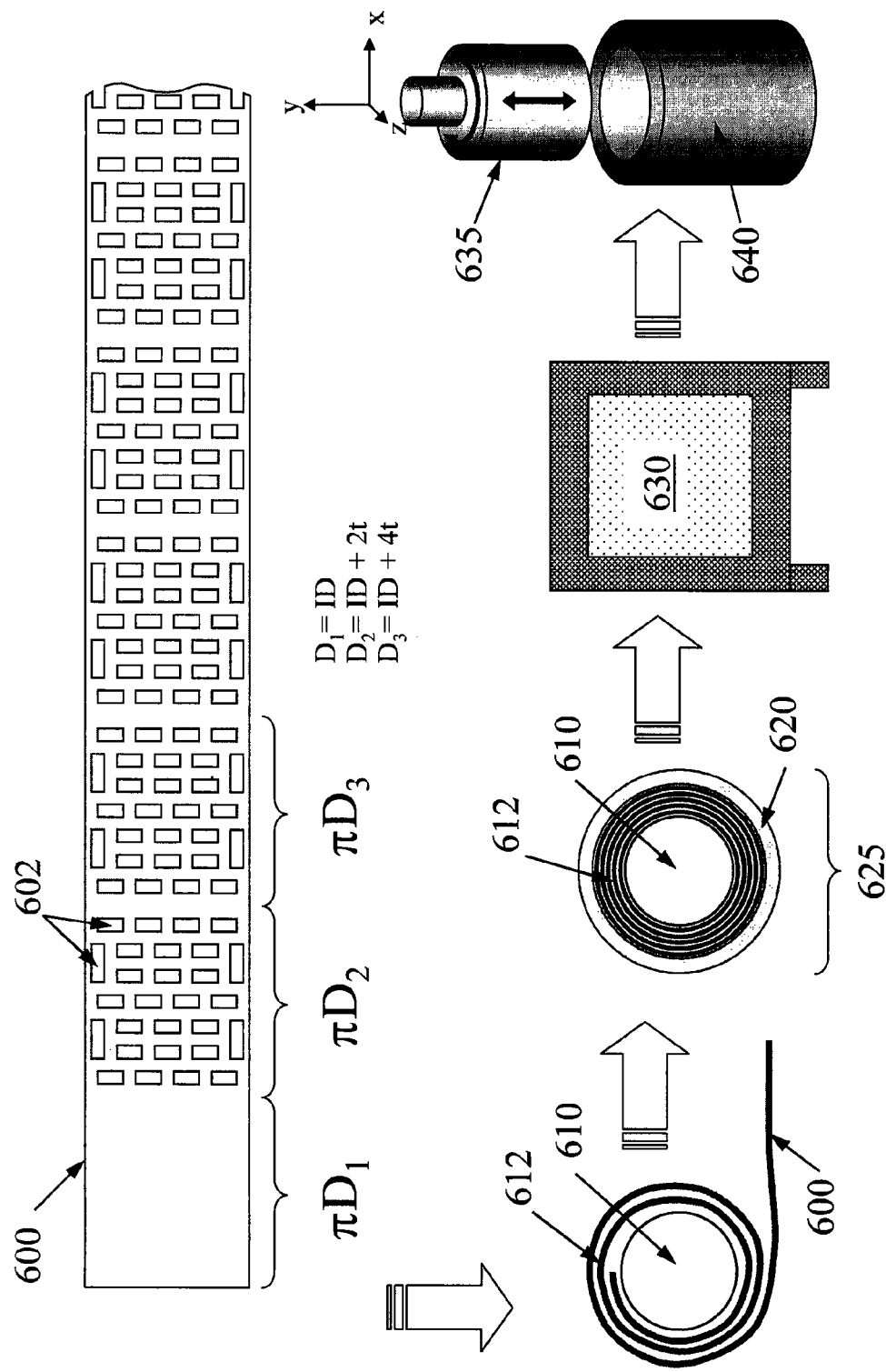
FIG. 31 illustrates a general schematic of exemplary cylindrical heat exchanger (HEX) construction, in accordance with aspects of the present disclosure.
Figure 32:
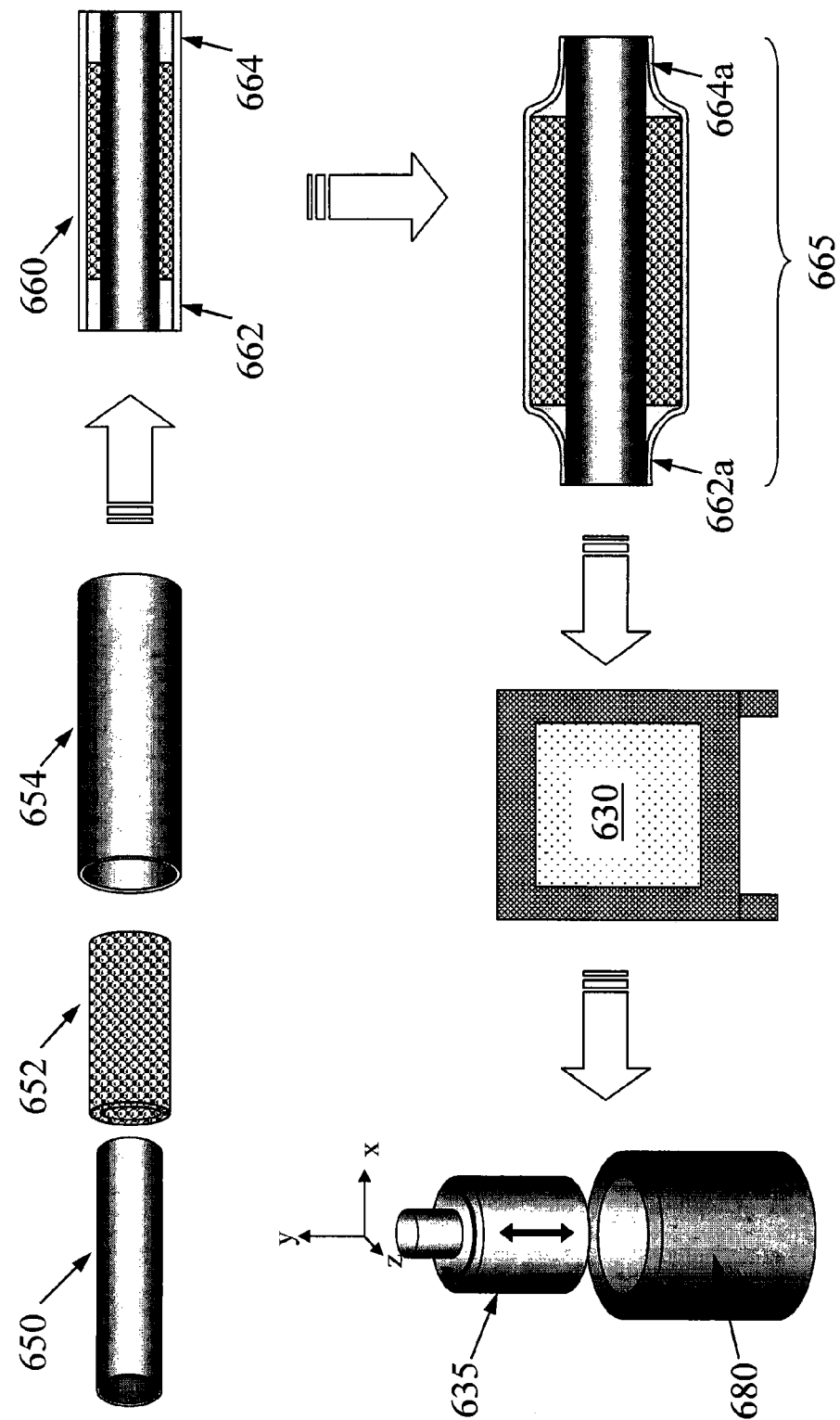
FIG. 32 illustrates a general schematic of an alternative exemplary method of cylindrical HEX construction, in accordance with aspects of the present disclosure.

The heat exchangers disclosed herein may be constructed in a number of acceptable manners, such as in accordance with those methods described in U.S. Pat. No. 4,730,666 and U.S. Pat. No. 5,611,214. Preferably, such heat exchangers are manufactured such that they have a thermal conductivity of at least 10 W/m-K (Watts per meter per Kelvin), preferably ranging from about 25 W/m-K to about 5000 W/m-K, including thermal conductivity values within this range, such as about 100 W/m-K, about 200 W/m-K, about 300 W/m-K, about 400 W/m-K, about 500 W/m-K, about 600 W/m-K, about 700 W/m-K, about 800 W/m-K, about 900 W/m-K, about 1000 W/m-K, about 1200 W/m-K, about 1500 W/m-K, about 2000 W/m-K, about 2500 W/m-K, about 3000 W/m-K, about 3500 W/m-K, about 4000 W/m-K, about 4500 W/m-K, and about 4900 W/m-K, as well as values and ranges within this range, such as in the range of from about 900 W/m-K to about 2300 W/m-K, or about 2900 W/m-K. In FIGS. 31-32, exemplary methods of construction of cylindrical heat exchangers (HEX) are given in accordance with aspects of the present disclosure. As suggested previously, the thermal heat exchangers described herein may be constructed of any appropriate material, such as a thermally conductive material, as will be known to those of skill in the art. In accordance with one suitable method of construction of cylindrical heat exchangers (HEX), such as cylindrical heat exchangers 400 and 450 described above, and as illustrated generally in FIG. 31, an etched or perforated sheet 600 of flexible and/or formable, thermally conductive material comprising a plurality of shaped or etched openings and/or surface feature channels 602 arranged in suitable patterns having a successively increasing pattern length corresponding initially to the cylindrical exchanger's inner diameter $D_1$ (and length of $D_1$) is created using appropriate methods known in the art. It will be apparent based upon this figure that as the perforated sheet 600 is concentrically wrapped, the periodicity or length of the pattern of openings 602 will similarly grow with each wrap, such that the first diameter D1 may have a pattern length of D1, the diameter D2 of the second wrapped layer may be D1+2t with pattern length D2, the diameter D3 of the third wrapped layer may be D1+4t, and so on. It is to be noted that the pattern illustrated in FIG. 31 is illustrative only of one preferred three-dimensional flow path for fluid within the cylindrical heat exchanger, and it is contemplated that such fluid flow paths may be periodic, aperiodic, symmetrical, asymmetrical, random, complicated, branching (e.g., fractal-based), top-to-bottom, and the like, without limitation. In example, and in reference to the general diagram of FIG. 31, the overall length of the sheet 600 would correspond to the summation of the lengths of all the circumferential layers of the cylindrical exchanger. To make the cylindrical exchanger leak-tight and to provide a solid surface for heat transfer, at least the first circumferential length of the sheet 600 would generally be without perforations (such that refrigerant does not leak through the orifices), and the subsequent circumferential lengths, which would be rolled into circumferential shells, are slightly larger in diameter in accordance with having to wrap over, and circumscribe, the first circumferential shell. The succeeding plurality of shells (which may be as many as necessary) would then also each be successively larger in turn, as suggested above with the discussion of perforation periodicity. At least the final shell layer would generally be without perforations to provide a leak tight outer shell. Either the at least first layer or the at least final layer, or both, may optionally have port perforations, generally distinct from the interior patterned perforations, to provide inlet and outlet flow ports into and out of the interior patterned perforations that form the interior fluid heat transfer surface of the cylindrical exchanger. Alternatively, ports may be fashioned by suitable patterns placed at the edges of sheet 600 which when successive layers are wrapped form fluid ports, or alternatively ports may be formed by drilling or the like after forming. Such methods for forming and manipulating the sheet material 600 as illustrated to form cylindrical heat exchangers in accordance with the present disclosure include but are not limited to mechanical methods such as laser drilling, stamping, and extruding; electroforming techniques such as hot embossing; and etching processes, such as wet etching, plasma etching, photochemical etching, chemical etching, laser etching, laser-assisted chemical etching, soft lithography techniques, and combinations of such etching processes. The sheet material 600 may optionally be clad, coated, plated, or the like on one or both side with materials suitable to bonding layers of sheet material 600 to itself during subsequent bonding processes. The perforated sheet may then be roll-formed on a mandrill or equivalent apparatus 610, or may be co-rolled with a sheet of bonding material (not shown) so that bonding material and sheet 610 form alternating layers as viewed in cross-section. For example, roll-formed cylindrical heat exchanger 612 can be formed using a small mandrill and a rotating machine by holding stationary one end of the straight length of tubing and forming a coil. As the coil is wrapped, the etched or shaped openings or surface patterns 602 thus form a 3D-type flow pattern inside the sheet material 600. Such methods of forming roll-formed coiled tubing such as 612 are well known to the industry. The flexible, thermally conductive material may be any appropriate thermally conductive material, including but not limited to copper; graphite; carbon (including diamond, diamond-carbon composites, oriented carbon graphite, and carbon nanotubes); nickel; silver; aluminum; materials coated with copper, silver, aluminum or nickel; metal alloys; solid solution phase alloys; nano-particulate materials; microfine materials; solid foam materials; lattice-type materials; composite materials; ceramic materials; green (unsintered) base materials including but not limited to unfired ceramics, glass ceramics, and the like which may further optionally contain filler materials as described above so as to enhance the thermal and mechanical properties of the base materials; elastomeric silicone; ceramics; polymeric materials such as epoxies, polyurethanes, bismaleimide (BMI), polyamide-imide, thermoplastic polyester (PET, PBT, etc.), and polysulphides (polyphenylene sulphide) any of which may be filled (such as with metals, minerals and the like); and transparent materials such as indium-tin oxide, all of which may further comprise fibers such as glass-fiber, silicon fiber, or yarn, and the like, so as to reinforce the flexible sheet layer and maximize reworkability. Following roll-forming, the sheet material 600 can be associated with any appropriate bonding support 620, forming a bonding support assembly 625. The assembly 625, comprising the perforated or etched sheet material 600, mandrill 610, and bonding support 620 may then be bonded, cured, glued, soldered, diffusion bonded, or the like, as appropriate to the materials of construction of sheet 600, in a bonding or brazing oven 630 (or the equivalent). By way of non-limiting example, the formed cylindrical heat exchanger 612 may be brazed by placing bonding support assembly 625 in oven 630 at a temperature ranging from above 840° F. but below the melting point of the base metal or material (e.g., about 1,981° F. for copper). Thus, in accordance with aspects of the present disclosure, the brazing may be performed at a temperature ranging from about 449° C. (840° F.) to about 1093° C. (2000° F.) for a period of time ranging from about 0.5 minutes to about 240 minutes or more, as appropriate, depending upon the material. While not illustrated in the Figure, these processes may also include one or more secondary steps, including but not limited to steps for aging, precipitation, hardening of material, and the like. The bonded cylindrical heat exchanger product after removal from the oven 630, may then be honed and polished by any appropriate polishing apparatus 635 using known methods, such that the cylindrical HEX product 640 is honed by rotation about its vertical y-axis, along its vertical axis in the y-direction, or both, as illustrated, in order to generate a smooth, well-defined interior surface. Equally, similar polishing processes well known in the art can be used to generate a smooth, well-defined exterior surface. While the disclosure above by example describes brazing the successive layers of the cylindrical HEX, one of ordinary skill in the art could equally acceptably bond the layers so they are glued, cured, sintered, diffusion bonded, soldered, etc. using suitable cladding, glue, or surface coating, etc., on the sheet 600 as appropriate to the selected materials and available equipment.

Alternatively, and equally acceptable, cylindrical heat exchangers 680 in accordance with the present disclosure may be formed in a concentric assembly manner, as illustrated generally in FIG. 32, using metal foam materials, such as open cell metal foam materials. As illustrated therein, a metal foam material 652 may be combined with a core 650 and a shell 654 to form a thermally conducting structure 660. The thermally conducting structure 660 is formed by a metal foam which preferably has numerous ligaments that form a network of interconnected void cells ("voids") randomly, periodically, or uniformly distributed and oriented in and/or through the foam for passing a fluid coolant through the block of metal foam in a direction that is generally parallel to the exterior surface of the foam. In accordance with certain aspects of the present disclosure, the metal foam 652 may comprise between about 5 and about 2000 voids (or pores) per inch, such as about 40 voids per inch, without limitation. Additionally, the pore size of the voids may vary from about 1 micron to about 4 mm, more preferably from about 0.1 mm to about 10 mm, and more preferably from about 0.4 mm to about 4 mm. More preferably, the number of pores per inch (ppi) of the porous structure of the metal foam can range from about 20 to about 50 ppi. The voids may be of any size and shape, such as triangular or dodecahedral, which will be the result of the manufacturing technique used to create the metal foam. These interconnected tortuous pathways formed by the ligaments and voids may also act to create turbulence in through-flowing fluids, thereby further disseminating the heat being transferred. Further defining characteristics of the metals foams which can be used in forming heat exchanger assemblies include but are not limited to metal foams having a surface area ranging from about 10 $in^2/in^3$ to about 90 $in^2/in^3$ (ligament surface area/metal foam volume), as well as values within this range, such as about 50 $in^2/in^3$, as well as theoretical mass density values ranging from about 10% to about 70%.

By way of non-limiting example, another means of creating the flow regions, in lieu of voids, is by using sintered metal powders, or green pressed metal powders that are partially sintered during the brazing process. Green pressed metal powders refers to metal powders having a characteristic green tensile strength (the ability of a pressed metal powder to resist deformation prior to being partially or fully sintered is known as the "green" strength of the pressed powder), as determined by such standard measurement techniques as ASTM-B312-96 (2000) [entitled "*Standard Test Method for Green Strength for Compacted Metal Powder Specimens*", ASTM International]. This may also include packed powder that may be sintered or non-sintered during the brazing process, wherein sintered, packed powder would be preferable.

By way of further non-limiting example, another means of creating the flow regions is by using packed particles, including rods, spheres, spheroids, or "shot" of appropriate materials, which may optionally be sintered or bonded before or during the brazing process.

By way of further non-limiting example, another means of creating the flow regions is by using a rolled structure such as roll-formed cylindrical heat exchanger 612 of FIG. 31, which may optionally be sintered or bonded before or during the brazing process.

Metal foams are useful for incorporation with heat exchangers of the present disclosure in that they have the advantage of being exceptionally heat-conductive, whereby the heat exchange between a first medium and a second medium can be maximized. In a particular preferred embodiment of the present disclosure, the metal foam can be manufactured from one or more of the following metals, without limitation—copper, nickel, stainless steel, high-temperature iron-based alloys (e.g., FeCrAlY), and aluminum. In addition, it is possible to envision manufacturing the metal foam from an alloy. Carbon foams may also be used in accordance with these aspects of the present disclosure. The covering shell 654 is preferably provided with a corrosion-resistant metal or a metal oxide in order to increase the durability of the heat exchanger (HEX) by preventing or at least countering degeneration of the heat exchanger.

With continued reference to FIG. 32, once the concentric assembly 660 has been formed with the metal foam 652 intermediate between the core 650 and the outer shell material 654, the ends 662, 664 are rolled and sealed or capped using any appropriate roll/sealing/capping means, and manifolds (not shown) are added, thereby forming the sealed assembly 665 with rolled/sealed/capped ends 662a, 664a. It may be further advantageous to roll exterior shell 660 in the region of the underlying foam core 652 to reduce clearances and facilitate bonding amongst the concentric layers. Following the roll-forming, sealing, and/or capping process, and addition of manifolds, the sealed metal foam cylindrical HEX assembly 665 is brazed in an appropriate brazing oven 630 (or the equivalent) at a temperature ranging from above 840° F. but below the melting point of the base metal or material (e.g., about 1,981° F. for copper). Thus, in accordance with aspects of the present disclosure, the brazing may be performed at a temperature ranging from about 449° C. (840° F.) to about 1093° C. (2000° F.) for a period of time ranging from about 0.5 minutes to about 240 minutes. This brazed cylindrical HEX product, after removal from oven 630, may then be honed and polished in any appropriate polishing apparatus 635 using known methods, such that the cylindrical metal-foam containing HEX product 680 is honed by rotation around its vertical y-axis, along its vertical axis in the y-direction, or both, as illustrated. While the disclosure above by example describes brazing the components of the cylindrical HEX, one of ordinary skill in the art could equally acceptably bond the layers so they are glued, cured, sintered, diffusion bonded, soldered, etc. using suitable cladding, glue, or surface coating, etc., on the components as appropriate to the selected materials and available equipment.

Figure 33:
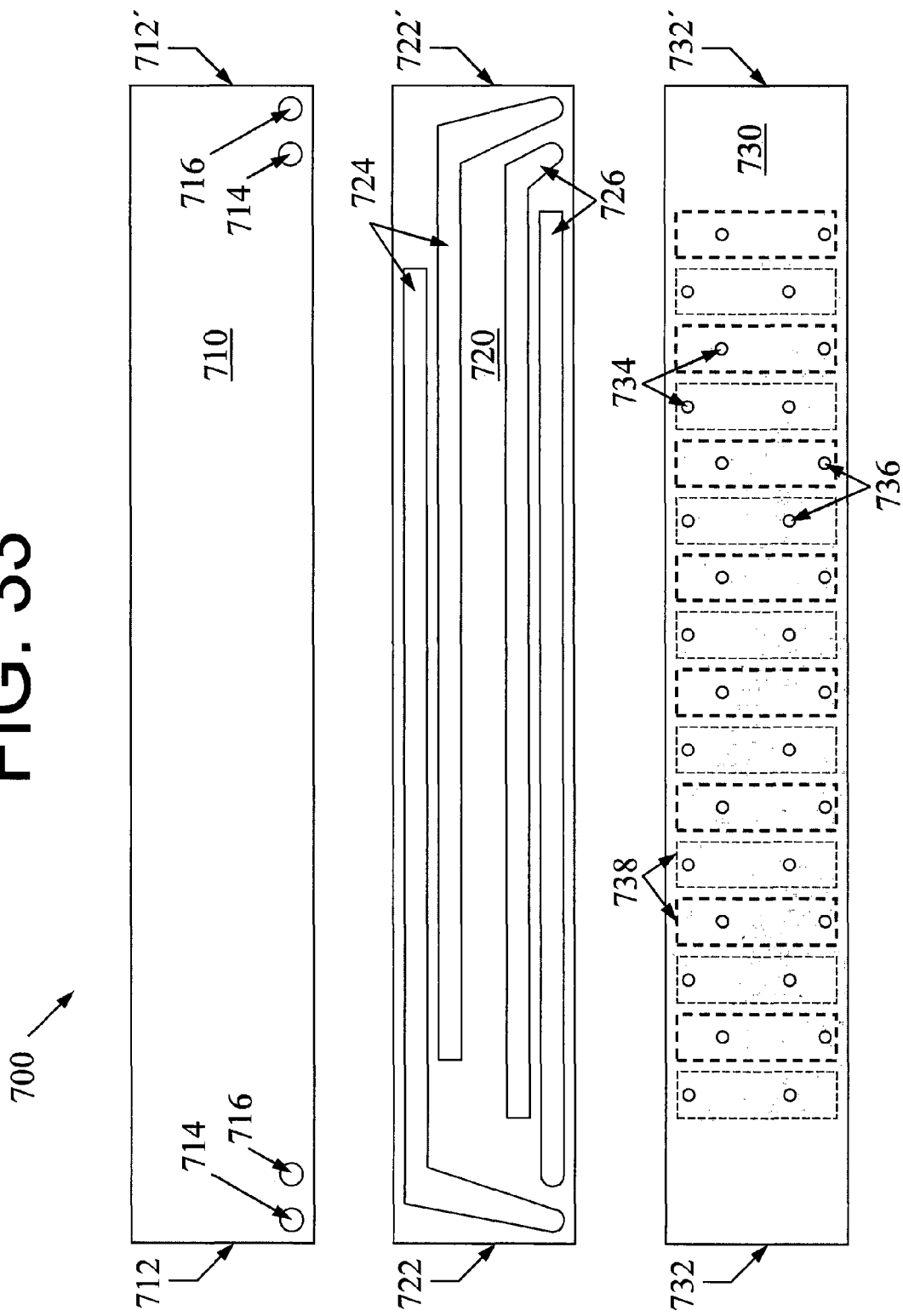
FIG. 33 illustrates an exemplary laminate manifold assembly.
Figure 34:
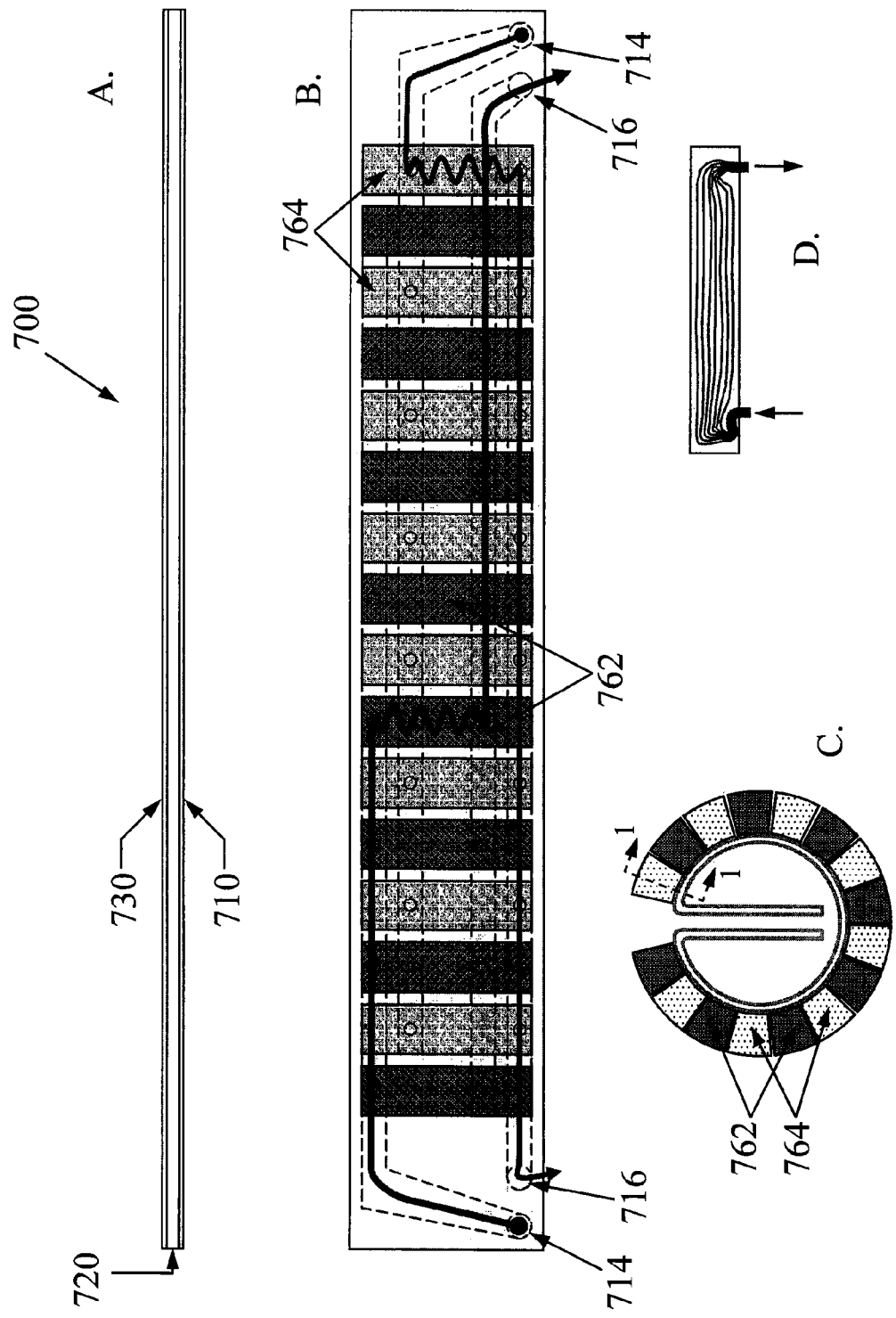

An exemplary, general construction process for a laminate manifold assembly 700 in accordance with the cylindrical HEX assemblies described in FIGS. 29-30, is illustrated in FIGS. 33-34. As shown in FIG. 33, typical laminate manifold assemblies 700 comprise at least one supply/return interface layer 710, at least one distribution layer 720, and at least one heat exchanger interface layer 730. The supply/return interface layer 710 is typically rectangularly-shaped and comprises first and second spaced apart ends 712 and 712'. At each of the spaced apart ends are inlet and outlet orifices 714 and 716, respectively. The intermediate distribution layer 720 is typically rectangularly-shaped and comprises first and second spaced-apart ends 722 and 722', respectively, and a plurality of elongated coolant supply orifices 724 and elongated coolant return orifices 726 extending at least a portion of the length of the distribution layer between spaced-apart ends 722 and 722'. Preferably, at least a portion of the elongated supply and return orifices 724 and 726 align with corresponding supply and return orifices 714 and 716, respectively, when the distribution layer 720 is overlaid on top of the supply/return interface layer 710. The heat exchanger interface layer 730 is typically rectangularly-shaped and comprises first and second spaced-apart ends 732 and 732', respectively, and a plurality of inlet and outlet orifices 734 and 736 respectively, positioned to accommodate a plurality of chassis cold plate annular-sector heat exchangers such as those described previously with respect to FIGS. 29 and 30, where the eventual position of those heat exchangers is indicated by dashed lines 738. A laminate manifold assembly 700 is created by stacking and bonding one or more each of laminate components 710, 720, 730. The laminate may be formed into a substantially cylindrical form as shown in FIGS. 29 and 30 either before or after the layers are bonded together, as appropriate for the laminate layer materials and bonding methods selected. While the assembly as illustrated in FIG. 33 is constructed of three layers, it is envisioned that the base laminate section may include additional layers of alternative patterns (not shown) which serve to help distribute fluid to the HEX segments, to reinforce the laminate, to provide the required spring or mechanical properties desired, or a similar function.

FIG. 34A illustrates a side view of laminate manifold assembly 700 after layers 710, 720, and 730 have been stacked together and bonded, but before the laminate has been formed into its curved shape to accept chassis cold plate annular sector heat exchange elements. As shown in FIG. 34A, typical laminate manifold assemblies 700 in accordance with the present disclosure are assembled such that the distribution layer 720 is sandwiched intermediate between the supply/return interface layer 710 and the heat exchanging interface layer 730.

FIG. 34B illustrates a top view of the unrolled laminate manifold with exemplary cooling paths illustrated from inlet 714, along the elongated coolant supply orifice 724, out the inlet supply orifice 734 and into the chassis cold plate heat exchange elements, through the elements, into the outlet return orifice 736, along the elongated coolant return orifice 726, and out the outlet 716. The plurality of HEX segments 762 and 764 may be attached to the laminate manifold assembly 700 before forming, as shown, or after forming the assembly 700 into a cylindrical format, or alternate shape as desired as shown in FIGS. 29 and 30, or other non-cylindrical, but generally curving shape, not shown, as desired. As illustrated in FIG. 34B, assembly 700 aligns the elongated orifices 724 of distribution layer 720 with both the inlet and outlet orifices 714 and 716 in the interface layer 710 and the inlet and outlet orifices 734, 736 of the heat exchanger interface layer. Inlet and outlet orifices 734a and 736a of chassis cold plate segments 762 and 764 are aligned with inlet and outlet orifices 734 and 736 and the HEX segments are bonded to the laminate, such that refrigerant/cooling liquid flow through the laminate manifold 700 and the HEX segments may be along the exemplary paths shown by the bold lines in FIG. 34B. The laminate assembly is shown unrolled in FIG. 34B for clarity of the exemplary cooling path, whereas in typical operation, the laminate and HEX segments would be formed as shown in FIG. 34C, and the path taken by the fluid would be a complex 3-dimensional flow path.

Exemplary flow within the HEX segments is shown in a cross-sectional view in FIG. 34D as taken along the section line 1-1 of FIG. 34C. Flow from the inlet of the HEX segment is distributed both vertically and horizontally in the segment, and generally passes from one end of the segment to the other, although multiple passes though the segment are possible. Given the plurality of HEX segments 762 and 764 attached to the laminate manifolds 700, there are a plurality of fluid flow paths. Each HEX segment contributes to the assembly's overall heat transfer capability as each segment is in thermal communication with the coolant flowing through it, thus forming a complete, segmented, cold plate chassis. Each HEX segment is also in thermal communication with a server rejection heat exchanger on its exterior surface, as shown in FIGS. 29 and 30. While the final circular laminate assembly is shown formed by rolling the manifold assembly into a substantially circular path, alternatively, and equally acceptable, the laminate may be bent into a multi-sided polygon figure which approaches a circular geometry as the number of segments is increased. In yet another alternative embodiment, the plurality of HEX segments 762 and 764 may be bonded to the laminate base after the laminate base has been formed into a circular or polygonal profile. The HEX segments 762 and 764 may have flat, curved, or stepped profiles accordingly in order to facilitate bonding to the laminate base.

As used herein, the actuating force(s) used to actuate the various translation mechanisms described above can be provided using various actuating means. Examples of such suitable actuating means include, but are not limited to, springs, mechanical linkages, such as pull/push rods, screw drives, hydraulics, electromechanical motors or actuators, and pneumatic actuators.

It is understood that the specific embodiments of the mounting assembly and the actuating mechanisms described above are for exemplary purposes only. In general, the rejector plate of the electronics server can be movable or fixed relative to the electronics server circuit board, and/or the chassis cold plate of the rack can be movable or fixed relative to the rack chassis, and any of the mounting assemblies and actuating mechanisms described herein can be applied to various combinations of movable and/or fixed rejector plate and chassis cold plate configurations.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

The invention has been described in the context of preferred and other embodiments and not every embodiment of the invention has been described. Obvious modifications and alterations to the described embodiments are available to those of ordinary skill in the art. The disclosed and undisclosed embodiments are not intended to limit or restrict the scope or applicability of the invention conceived of by the Applicants, but rather, in conformity with the patent laws, Applicants intend to protect all such modifications and improvements to the full extent that such falls within the scope or range of equivalent of the following claims.

What is claimed is:

1. A thermal interface system between an electronic component and an electronic component chassis, the system comprising:
    a first heat exchanger associated with the electronic component, wherein the electronic component is a microprocessor, an integrated circuit, an electronic server, a rack server, or a blade server having one or more heat generating objects;
    a second heat exchanger associated with the chassis and aligned to interface with the first heat exchanger when the electronic component is housed in the chassis; and
    a thermal contact mechanism that selectively applies pressure between the first and second heat exchangers to engage the first and second heat exchangers in thermal communication, and wherein the mechanism isolates the pressure applied between the first and second heat exchangers from the electronic component;
    wherein the electronic component is configured to be inserted into the chassis along an insertion vector, and wherein the interface between the first and second heat exchangers is substantially parallel to the insertion vector; and
    wherein the pressure applied between the first and second heat exchangers is applied substantially perpendicular to the insertion vector.

2. The system of claim 1, wherein the electronic component further comprises a liquid-based cooling system comprising a cold plate configured to transfer heat from one or more of the heat generating objects to the liquid and wherein the first heat exchanger comprises a rejector plate heat exchanger.

3. The system of claim 2, wherein the first heat exchanger is a cylindrical heat exchanger and wherein the second heat exchanger is an annular heat exchanger configured to receive the first heat exchanger.

4. The system of claim 2, wherein the second heat exchanger is a cylindrical heat exchanger and wherein the first heat exchanger is an annular heat exchanger configured to receive the second heat exchanger.

5. The system of claim 3, wherein the thermal contact mechanism is an expandable bladder associated with the cylindrical heat exchanger.

6. The system of claim 4, wherein the thermal contact mechanism is an expandable bladder associated with the cylindrical heat exchanger.

7. The system of claim 1, further comprising a thermal interface material between interfacing surfaces of the first and second heat exchangers.

8. The system of claim 7, wherein the thermal interface material is thermal grease or a thermal pad.

9. The system of claim 1, wherein the second heat exchanger is thermally coupled to an external heat exchanger.

10. The system of claim 1, wherein the thermal contact mechanism is selected from the group consisting of: a mechanical clamp; a spring; a hydraulic motor, a pneumatic motor; an electromechanical motor; a hydraulic actuator, a pneumatic actuator; an electromechanical actuator and any combination of the foregoing.

11. The system of claim 1, wherein the thermal contact mechanism is an expandable bellows or bladder.

12. The system of claim 1, wherein the interface surfaces of the first and second heat exchangers are smooth.

13. The system of claim 1, wherein the interface surfaces of the first and second heat exchangers are textured.

14. The system of claim 1, wherein the thermal contact mechanism is activated when the electronic component is locked into the chassis.

15. The system of claim 1, wherein the thermal contact mechanism is configured to create an engagement pressure between the first and second heat exchanger of up to about 30 psi.

16. The system of claim 1, wherein the thermal contact mechanism is configured to create an engagement pressure between the first and second heat exchanger of more than about 30 psi.

17. A system for transferring heat from a plurality of heat producing electronic components housed in a chassis, the system comprising:
- a chassis configured to accept and selectively electronically couple the plurality of electronic components, and comprising a chassis closed loop cooling system having one or more cold plate chassis heat exchangers configured to transfer heat from an associated electronic component;
- a plurality of electronic components having one or more heat generating objects, each electronic component configured to be inserted into the chassis along a chassis insertion vector, each electronic component comprising a component closed loop cooling system including a rejecting plate heat exchanger configured to interface with and thermally communicate with an associated chassis heat exchanger when the electronic component is housed within the chassis;
- a thermal interface material disposed at an interface between the rejecting plate heat exchanger and the associated chassis heat exchanger; and
- a contact mechanism that selectively applies force to at least one of the rejecting plate heat exchanger and the associated chassis heat exchanger to contact the rejecting plate heat exchanger and the associated chassis heat exchanger across the thermal interface material thereby placing the rejecting plate heat exchanger and the associated chassis heat exchanger in thermal communication and wherein the contact mechanism isolates the force applied to the at least one rejecting plate heat exchanger and the associated chassis heat exchanger from the electronic component;

wherein the force applied to the at least one reflecting plate heat exchanger and the associated chassis heat exchanger is applied substantially perpendicular to the insertion vector.

18. The system of claim 17, wherein the electronic component is a microprocessor, an integrated circuit, an electronic server, a rack server, or a blade server.

19. The system of claim 18, wherein the rejecting plate heat exchanger is a cylindrical heat exchanger and wherein the associated chassis heat exchanger is an annular heat exchanger configured to receive the rejecting plate heat exchanger.

20. The system of claim 18, wherein the associated chassis heat exchanger is a cylindrical heat exchanger and wherein the rejecting plate heat exchanger is an annular heat exchanger configured to receive the chassis heat exchanger.

21. The system of claim 19, wherein the contact mechanism is an expandable bladder associated with the cylindrical heat exchanger.

22. The system of claim 20, wherein the contact mechanism is an expandable bladder associated with the cylindrical heat exchanger.

23. The system of claim 17, wherein the thermal interface material is thermal grease or a thermal pad.

24. The system of claim 17, wherein chassis heat exchanger is thermally coupled to an external heat exchanger.

25. The system of claim 17, wherein the interface between the rejecting plate heat exchanger and the associated chassis heat exchanger is substantially parallel to the insertion vector.

26. The system of claim 17, wherein the contact mechanism is selected from the group consisting of: a mechanical clamp; a spring; a hydraulic motor, a pneumatic motor; an electromechanical motor; a hydraulic actuator, a pneumatic actuator; an electromechanical actuator and any combination of the foregoing.

27. The system of claim 17, wherein the contact mechanism is an expandable bellows or bladder.

28. The system of claim 17, wherein the interface surfaces of the heat exchangers are smooth.

29. The system of claim 17, wherein the interface surfaces of the heat exchangers are textured.

30. The system of claim 17, wherein the contact mechanism is activated when the electronic component is locked into the chassis.

31. The system of claim 17, wherein the contact mechanism is configured to create up to about 30 psi.

32. The system of claim 17, wherein the contact mechanism is configured to create more than 30 psi.

33. A method of transferring heat from an electronic component housed in a chassis, the method comprising:
- providing a chassis that operatively houses one or more electronic components;
- inserting an electronic component into the chassis along an insertion vector, the electronic component comprising one or more heat generating objects and a cooling system having a first heat exchanger;

providing a second heat exchanger associated with the chassis and aligned to interface with the first heat exchanger when the electronic component is housed in the chassis;

activating a contact mechanism that forces the first and second heat exchangers into thermal communication such that a force between the first and second heat exchangers is applied substantially perpendicular to the insertion vector and is isolated from the electronic component; and transferring heat from the electronic component to the second heat exchanger.

34. The method of claim 33, further comprising transferring heat from the second heat exchanger to another heat exchanger that is external to the chassis.

35. The method of claim 33, further comprising providing a thermal interface material at an interface between the first and second heat exchanger.

\* \* \* \* \*